US012707605B2

(12) United States Patent
Masuyama et al.

(10) Patent No.: US 12,707,605 B2

(45) Date of Patent: Aug. 11, 2026

(54) ELECTRONIC DEVICE

(71) Applicant: Mitsubishi Electric Corporation, Tokyo (JP)

(72) Inventors: Takahiro Masuyama, Tokyo (JP); Hirokazu Takabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 284 days.

(21) Appl. No.: 18/555,891

(22) PCT Filed: Dec. 23, 2021

(86) PCT No.: PCT/JP2021/047825

§ 371 (c)(1), (2) Date: Oct. 18, 2023

(87) PCT Pub. No.: WO2022/264460

PCT Pub. Date: Dec. 22, 2022

(65) Prior Publication Data

US 2024/0206132 A1 Jun. 20, 2024

(30) Foreign Application Priority Data

Jun. 16, 2021 (WO) .................. PCT/JP2021/022795

(51) Int. Cl.

*H05K 7/20* (2006.01)

(52) U.S. Cl.

CPC ..... *H05K 7/20854* (2013.01); *H05K 7/20336* (2013.01); *H05K 7/20418* (2013.01); *H05K 7/20881* (2013.01)

(58) Field of Classification Search

CPC ........... H05K 7/20854; H05K 7/20336; H05K 7/20418; H05K 7/20881; H05K 7/2089;

(Continued)

(56) References Cited

U.S. PATENT DOCUMENTS 4,795,859 A * 1/1989 Kato .......................... B60L 1/04 191/11

5,793,611 A 8/1998 Nakazato et al.

(Continued)

FOREIGN PATENT DOCUMENTS

CN 105845648 A * 8/2016 ........... H01L 23/367

JP H07283564 A 10/1995

(Continued)

OTHER PUBLICATIONS

CN-105845648-A Translation (Year: 2016).*

(Continued)

*Primary Examiner* — Jayprakash N Gandhi

*Assistant Examiner* — Matthew Sinclair Muir

(74) *Attorney, Agent, or Firm* — BUCHANAN, INGERSOLL & ROONEY PC

(57) ABSTRACT

An electronic device includes a heat-receiving block, a heat transfer member, and fins. The heat-receiving block has a first main surface to which an electronic component is attached. The heat transfer member is attached to a second main surface of the heat-receiving block opposite to the first main surface, and transfers heat transferred from the electronic component through the heat-receiving block in a direction away from the second main surface. The fins have main surfaces and are attached to the heat transfer member with the main surfaces being inclined with respect to a horizontal plane for a vehicle being located horizontally. The fins dissipate heat transferred from the electronic component through the heat-receiving block and the heat transfer member into ambient air.

20 Claims, 22 Drawing Sheets

(58) Field of Classification Search
CPC . H05K 7/209; H05K 7/20909; H05K 7/20918
See application file for complete search history.

(56) References Cited

U.S. PATENT DOCUMENTS

| | | | | |
|---|---|---|---|---|
| 11,266,041 | B2 * | 3/2022 | Kim | H05K 7/20336 |
| 2015/0016171 | A1 * | 1/2015 | Yasuda | B61K 13/00 363/141 |
| 2016/0255746 | A1 * | 9/2016 | Karlstedt | H01L 23/38 62/3.2 |

FOREIGN PATENT DOCUMENTS

| | | | | | |
|---|---|---|---|---|---|
| JP | 2000092819 | A | | 3/2000 | |
| JP | 2000161880 | A | | 6/2000 | |
| JP | 2003079164 | A | * | 3/2003 | |
| JP | 2009124038 | A | | 6/2009 | |
| JP | 2011233562 | A | * | 11/2011 | |
| KR | 20210061682 | A | * | 5/2021 | H05K 7/20936 |

OTHER PUBLICATIONS

JP-2003079164-A Translation (Year: 2003).*
KR-20210061682-A Translation (Year: 2021).*
JP-2011233562-A Translation (Year: 2011).*
International Search Report (PCT/ISA/210) with translation mailed on Mar. 29, 2022, by the Japan Patent Office as the International Searching Authority for International Application No. PCT/JP2021/047825. (5 pages).

* cited by examiner

1
IV
232 23 231
231 23 232
231 30a
23 23
232 232
30
24b
22
21b
24a
21
20
20a SW1 SW1 SW2 SW2 SW3 SW3 21a
100a
100
IV

1
AR2 AR2
232 23 231 231 23 232
AR2 231 231 30a
23 23 AR2
232 232
24b 30
22 21b
AR3 AR3
24a 21
20
20a SW1 SW1 SW2 SW2 SW3 SW3 21a
100a
100

2
θ1 D1 D2 θ2
23 231 231 23 232
232 231 232 231 30a
232 23 23 232
24b 30
20 22 21b
24a 21
100a 100b
20a SW1 SW1 SW2 SW2 SW3 SW3 21a
100

2
AR4
232
23
231
231
23
232
AR4
30a
231
23
232
30
232
23
231
24b
AR5
AR5
21b
100a
22
21
100b
24a
20a
SW1
SW1
SW2
SW2
SW3
SW3
21a
20
100

3

XIII 30a
30
51b 52
51c 53
51
51b
51b
53
51c
52
51b
51
21b
51a
20
51a
21
20a
SW1
SW1
SW2
SW2
SW3
SW3
21a
100a
100

XIII

3

AR6 AR6 AR6 AR6

51b 52 51c 53 30 30a 51 51c 53

51b 52

51b 51b 51

AR7 21b AR7

51a 20 21

51a

20a SW1 SW1 SW2 SW2 SW3 SW3 21a 100a 100

4
XVI
30a
30
51d
53
51b
52
51
51b
51b
51d
53
52
51b
51
51a
21
20
51a
20a
SW1
SW1
SW2
SW2
SW3
SW3
21a
100a
100
XVI

ELECTRONIC DEVICE

TECHNICAL FIELD

The present disclosure relates to an electronic device.

BACKGROUND ART

An electronic device, such as a power converter, installed on a railway vehicle dissipates heat generated by electronic components with a cooler into airflow created by the traveling vehicle to cool the electronic components. Patent Literature 1 describes an example of such an electronic device. The power converter described in Patent Literature 1 is attached to the roof of a railway vehicle, and includes fins attached to an upper surface and a side surface of a housing.

CITATION LIST

Patent Literature

Patent Literature 1: Unexamined Japanese Patent Application Publication No. 2009-124038

SUMMARY OF INVENTION

Technical Problem

The power converter described in Patent Literature 1 flows airflow created by a traveling railway vehicle between the fins to cool electronic components, such as a semiconductor element, accommodated in the housing of the power converter. The power converter supplies power to electronic devices installed on the railway vehicle, for example, an air-conditioning device or a lighting device, and operates when the railway vehicle is traveling as well as when the railway vehicle is stopped. Thus, the electronic components in the power converter generate heat also when the railway vehicle is stopped.

The above electronic components in the power converter described in Patent Literature 1 generate heat also when the railway vehicle is stopped. The electronic components are thus not fully cooled when the railway vehicle is stopped. In other words, the power converter described in Patent Literature 1 has insufficient cooling performance through natural convection. This issue is common to the power converter that supplies power to, for example, the air-conditioning device or the lighting device installed on the railway vehicle as well as to an electronic device including electronic components that generate heat when a vehicle is stopped, in addition to when the vehicle is traveling.

In response to the above circumstances, an objective of the present disclosure is to provide an electronic device that can cool electronic components also when a vehicle is stopped.

Solution to Problem

To achieve the above objective, an electronic device according to an aspect of the present disclosure includes a heat conductive heat-receiving block, a heat transfer member, and one or more fins. The heat-receiving block has a first main surface to which an electronic component is attached. The heat transfer member is attached to a second main surface of the heat-receiving block. The second main surface is opposite to the first main surface. The heat transfer member extends away from the second main surface to transfer heat transferred from the electronic component through the heat-receiving block in a direction away from the second main surface. The one or more fins have main surfaces, and are attached to the heat transfer member with the main surfaces being inclined with respect to a horizontal plane for the vehicle being located horizontally. The one or more fins dissipate heat transferred from the electronic component through the heat-receiving block and the heat transfer member into ambient air.

Advantageous Effects of Invention

The electronic device according to the above aspect of the present disclosure includes the heat transfer member to transfer heat from the electronic component, and the one or more fins attached to the heat transfer member with the main surfaces inclined with respect to a horizontal plane for the vehicle being located horizontally. The fins dissipate heat transferred from the electronic component into air. Thus, the electronic device can cool the electronic component also when the vehicle is stopped.

DESCRIPTION OF EMBODIMENTS

An electronic device according to one or more embodiments of the present disclosure is described below in detail with reference to the drawings. In the figures, the same reference signs denote the same or equivalent components.

Embodiment 1

As an example of an electronic device, a power converter is installable on a railway vehicle to convert alternating current (AC) power supplied from an AC power supply to AC power to be supplied to a load and to supply the resulting AC power to the load. An electronic device 1 according to Embodiment 1 is described using, in an example, a power converter installed on the roof of a railway vehicle to cool electronic components through natural convection and airflow, the airflow being airflow caused by a traveling railway vehicle and flowing in a direction opposite to the travel direction of the railway vehicle.

Figure 1:
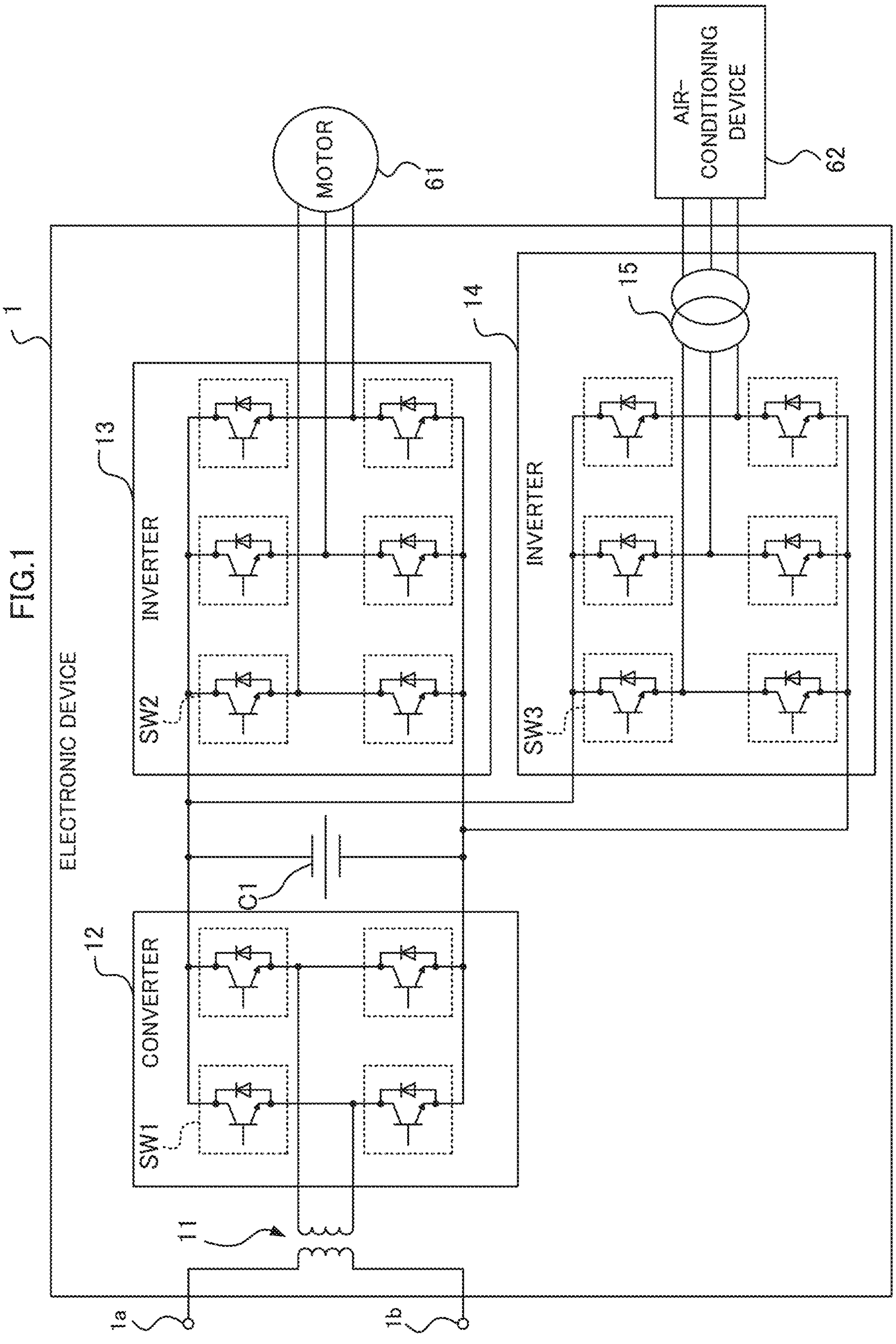
FIG. 1 is a block diagram of an electronic device according to Embodiment 1.

The electronic device 1 illustrated in FIG. 1 is installed on an AC feeding railway vehicle. The electronic device 1 converts supplied AC power to AC power appropriate for a motor 61 and an air-conditioning device 62 serving as example loads, and supplies the resulting AC power to the motor 61 and the air-conditioning device 62. The motor 61 is, for example, a three-phase induction motor that generates propulsion of the railway vehicle. When the electronic device 1 supplies power to the motor 61 during traveling of the railway vehicle, or more specifically, during power running, the motor 61 generates propulsion of the railway vehicle. The air-conditioning device 62 is an air conditioner in the railway vehicle. When the electronic device 1 supplies power to the air-conditioning device 62 during the operation of the railway vehicle, or more specifically, during traveling or stopping of the railway vehicle, the air-conditioning device 62 operates to adjust the temperature in the railway vehicle to an intended temperature.

The components of the electronic device 1 are described below. The electronic device 1 includes an input terminal 1*a* connected to the power supply and an input terminal 1*b* grounded. The electronic device 1 further includes a transformer 11 that lowers the voltage of AC power supplied from the power supply connected to the input terminal 1*a*, a converter 12 that converts the AC power having the voltage lowered by the transformer 11 to DC power, a capacitor C1 charged with the DC power output from the converter 12, and inverters 13 and 14 that convert the DC power input through the capacitor C1 to AC power.

The input terminal 1*a* is electrically connected to, for example, a current collector that acquires AC power supplied from an electrical substation through a power line. For example, the power line is an overhead power line or a third rail. The current collector is a pantograph or a current collector shoe. The input terminal 1*b* is short-circuited to rails through a ground brush, which is not illustrated, and is grounded.

The transformer 11 includes a primary winding having one end connected to the input terminal 1*a* and the other end connected to the input terminal 1*b*, and a secondary winding connected to the converter 12. For example, the transformer 11 lowers single-phase AC power with a voltage of 25 kV supplied from the current collector to single-phase AC power with a voltage of 1520 V, and supplies the AC power with the lowered voltage to the converter 12.

The converter 12 includes two pairs of two switching elements SW1 that are connected in series. The switching elements SW1 in one pair and the switching elements SW1 in the other pair are connected in parallel. One end of the secondary winding of the transformer 11 is connected to the connecting point of the two switching elements SW1 in one pair, and the other end of the secondary winding of the transformer 11 is connected to the connecting point of the two switching elements SW1 in the other pair.

Each switching element SW1 includes an insulated-gate bipolar transistor (IGBT) and a freewheeling diode including an anode connected to an emitter terminal of the IGBT and a cathode connected to a collector terminal of the IGBT. A controller, which is not illustrated, provides a gate signal to a gate terminal of the IGBT included in each switching element SW1 included in the converter 12 to turn on or off the IGBT, or in other words, to turn on or off the switching element SW1. Each switching element SW1 performs switching to cause the converter 12 to convert AC power supplied from the transformer 11 to DC power.

The capacitor C1 is charged with DC power output from the converter 12. The capacitor C1 has one end connected to a connecting point between a positive terminal of the converter 12 and primary positive terminals of the inverters 13 and 14, and the other end connected to a connecting point between a negative terminal of the converter 12 and primary negative terminals of the inverters 13 and 14.

The inverter 13 includes three pairs of two switching elements SW2 that are connected in series. The three pairs of switching elements SW2 correspond to a U phase, a V phase, and a W phase of three-phase AC power, respectively. The switching elements SW2 corresponding to the U phase, the switching elements SW2 corresponding to the V phase, and the switching elements SW2 corresponding to the W phase are connected parallel to one another. Similarly to the switching elements SW1, each switching element SW2 includes an IGBT and a freewheeling diode. A controller, which is not illustrated, provides a gate signal to a gate terminal of the IGBT included in each switching element SW2 included in the inverter 13 to turn on or off the IGBT, or in other words, to turn on or off the switching element SW2. Each switching element SW2 performs switching to cause the inverter 13 to convert DC power to three-phase AC power and supply the three-phase AC power to the motor 61.

The inverter 14 includes three pairs of two switching elements SW3 that are connected in series. The three pairs of switching elements SW3 correspond to the U phase, the V phase, and the W phase of three-phase AC power, respectively. The switching elements SW3 corresponding to the U phase, the switching elements SW3 corresponding to the V phase, and the switching elements SW3 corresponding to the W phase are connected parallel to one another. Similarly to the switching elements SW1, each switching element SW3 includes an IGBT and a freewheeling diode. A controller, which is not illustrated, provides a gate signal to a gate terminal of the IGBT included in each switching element SW3 included in the inverter 14 to turn on or off the IGBT, or in other words, to turn on or off the switching element SW3. Each switching element SW3 performs switching to cause the inverter 14 to convert DC power to three-phase AC power.

The inverter 14 further includes a transformer 15 that lowers the voltage of the three-phase AC power converted from DC power to a voltage appropriate for the air-conditioning device 62. The three-phase AC power with the voltage lowered by the transformer 15 is supplied to the air-conditioning device 62.

When the railway vehicle is traveling, the converter 12 and the inverters 13 and 14 are in operation. Thus, the switching elements SW1, SW2, and SW3 are repeatedly turned on and off, or more specifically, perform switching and generate heat. When the railway vehicle is stopped, the motor 61 receives no power, but the air-conditioning device 62 is to operate although the railway vehicle is stopped. Thus, when the railway vehicle is stopped, the inverter 13 is stopped, and the converter 12 and the inverter 14 are in operation. In other words, the switching elements SW2 generate no heat, whereas the switching elements SW1 and SW3 are repeatedly turned on and off and generate heat. Thus, the electronic device 1 cools electronic components including the switching elements SW1, SW2, and SW3 with airflow created by the traveling railway vehicle, and cools electronic components including the switching elements SW1 and SW3 through natural convection when the railway vehicle is stopped.

Figure 2:
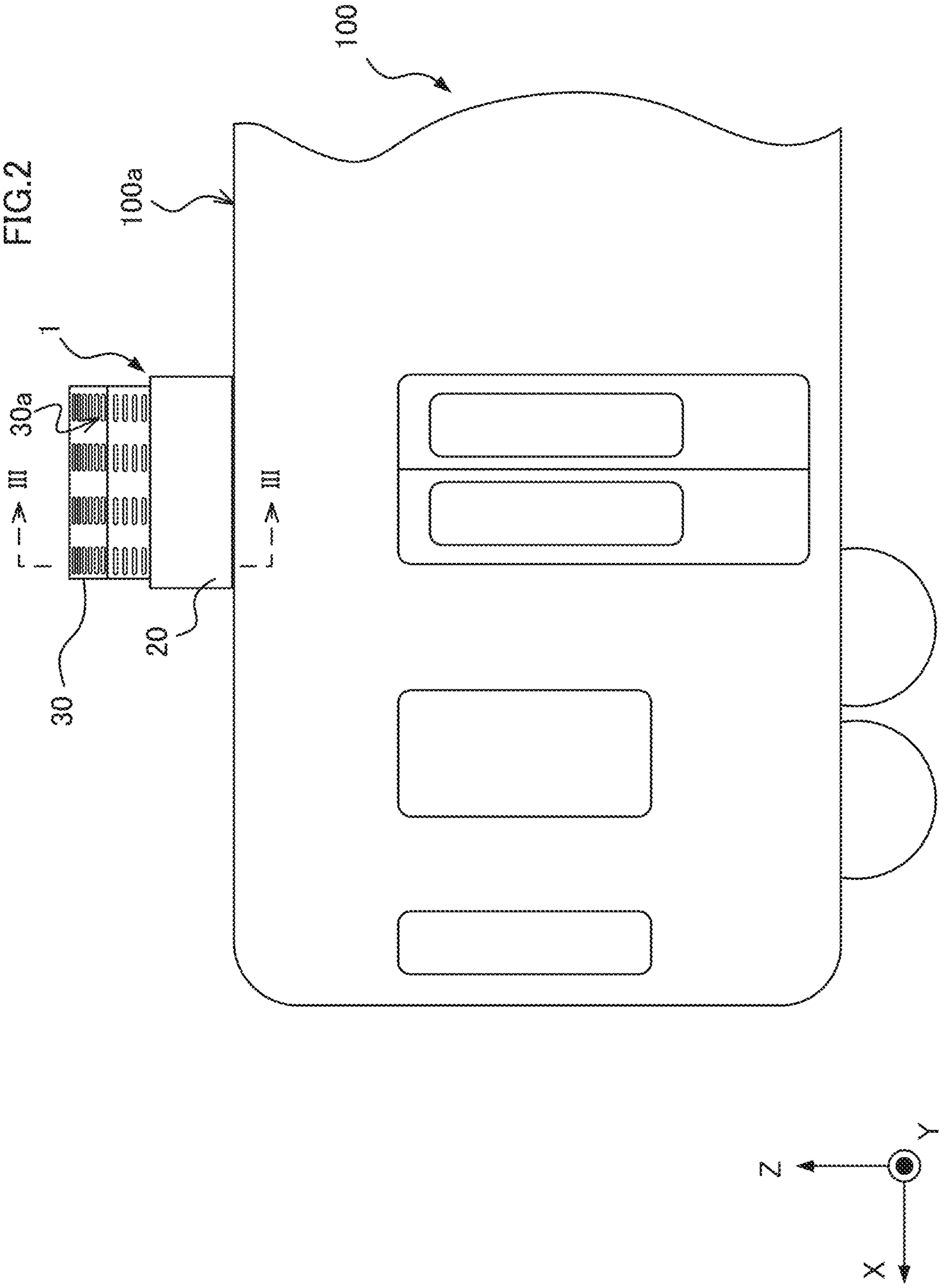
FIG. 2 is a diagram of the electronic device according to Embodiment 1, illustrating an example installation on a vehicle.
Figure 3:
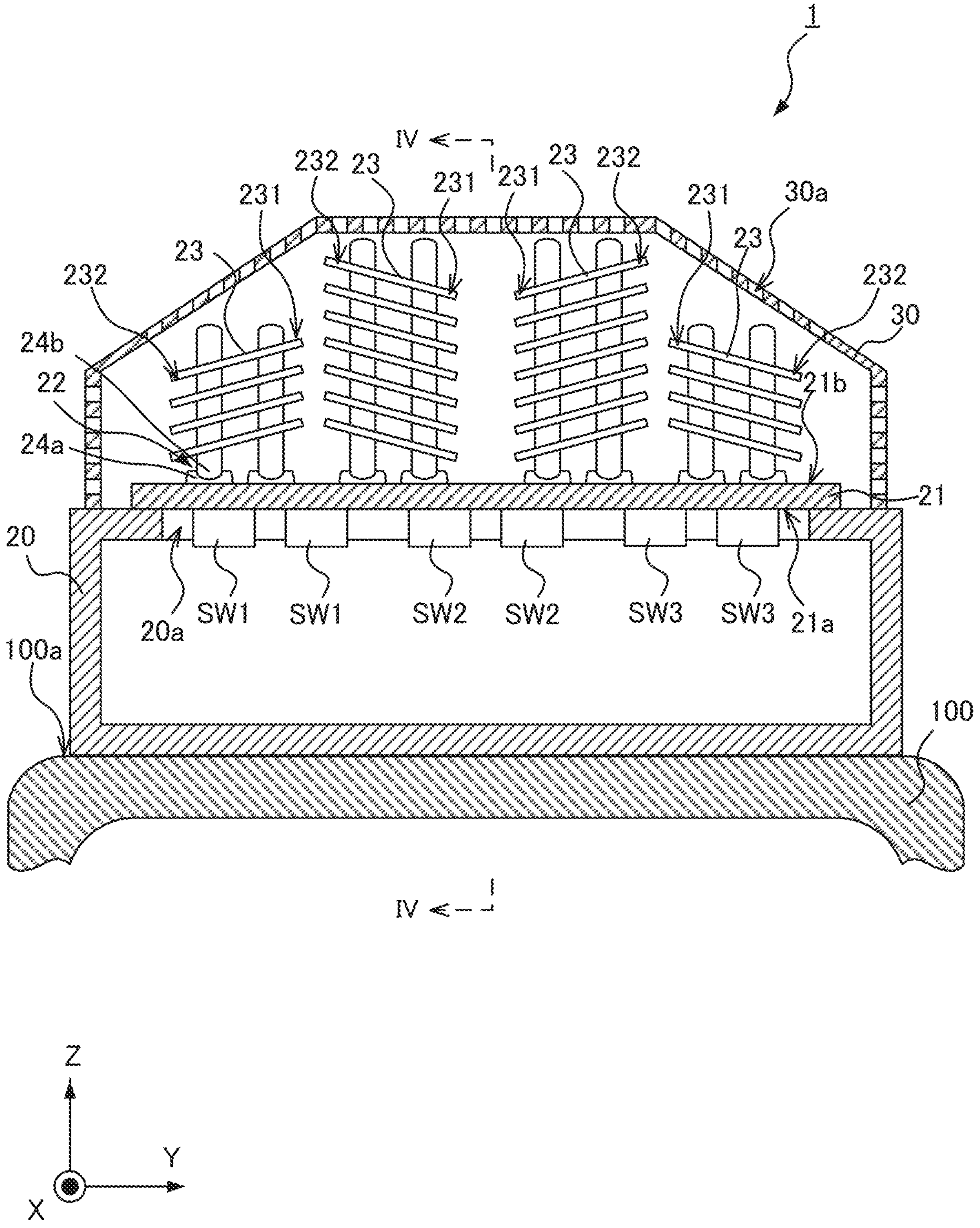
FIG. 3 is a cross-sectional view of the electronic device according to Embodiment 1 taken along line III-III as viewed in the direction indicated by the arrows in FIG. 2.

The structure of the electronic device 1 is described in detail below. As illustrated in FIG. 2, the electronic device 1 is installed on a roof 100*a* of a vehicle 100. As illustrated in FIG. 3 that is a cross-sectional view of the electronic device 1 taken along line III-III as viewed in the direction indicated by the arrows in FIG. 2, the electronic device 1 includes a housing 20 located on the roof 100*a* and accommodating electronic components including the switching elements SW1, SW2, and SW3, and a heat-receiving block 21 that is heat conductive and attached to the housing 20 to cover an opening 20*a* of the housing 20. The heat-receiving block 21 has a first main surface 21*a* receiving electronic components. The electronic device 1 further includes heat transfer members 22 and fins 23. The heat transfer members 22 are attached to a second main surface 21*b* of the heat-receiving block 21, and transfer heat transferred from the electronic components through the heat-receiving block 21 in a direction away from the second main surface 21*b*. The fins 23 are attached to the heat transfer members 22, and dissipate heat transferred from the electronic components through the heat-receiving block 21 and the heat transfer members 22 into air.

To suppress breakage of the heat transfer members 22 and the fins 23, the electronic device 1 preferably includes a cover 30 attached to the housing 20 to cover the heat transfer members 22 and the fins 23.

In FIGS. 2 and 3, Z-axis indicates a vertical direction for the vehicle 100 located horizontally. X-axis indicates a travel direction of the vehicle 100. Y-axis indicates a width direction of the vehicle 100. X-axis, Y-axis, and Z-axis are perpendicular to one another. The same applies to the subsequent figures.

The housing 20 is attached to a vertically upper portion of the roof 100*a*. The housing 20 has such high rigidity and strength as to resist deformation under the maximum expected vibration from the railway vehicle. For example, the housing 20 is formed from metal such as iron or aluminum. The housing 20 has the opening 20*a* in a vertically upper portion.

The heat-receiving block 21 is attached to the housing 20 to cover the opening 20*a*. In Embodiment 1, the heat-receiving block 21 is a plate of a highly thermally conductive material including metal such as iron or aluminum, and is attached to the outer surface of the housing 20 to cover the opening 20*a*. Electronic components that generate heat, or more specifically, the switching elements SW1, SW2, and SW3, are attached to the first main surface 21*a* of the heat-receiving block 21. The heat transfer members 22 are attached to the second main surface 21*b* opposite to the first main surface 21*a*. For the vehicle 100 located horizontally, the first main surface 21*a* and the second main surface 21*b* extend horizontally.

Each heat transfer member 22 extends away from the second main surface 21*b*, and transfers heat transferred from the electronic components through the heat-receiving block 21 in a direction away from the second main surface 21*b*. In Embodiment 1, each heat transfer member 22 includes a heat pipe that contains a coolant therein. More specifically, each heat transfer member 22 serving as a heat pipe includes a header 24*a* attached to the heat-receiving block 21 and a branch pipe 24*b* attached to the header 24*a* and continuous with the header 24*a*. The header 24*a* and the branch pipe 24*b* contain a coolant in vapor and liquid phases at ordinary temperature. An example of the coolant is water.

Figure 4:
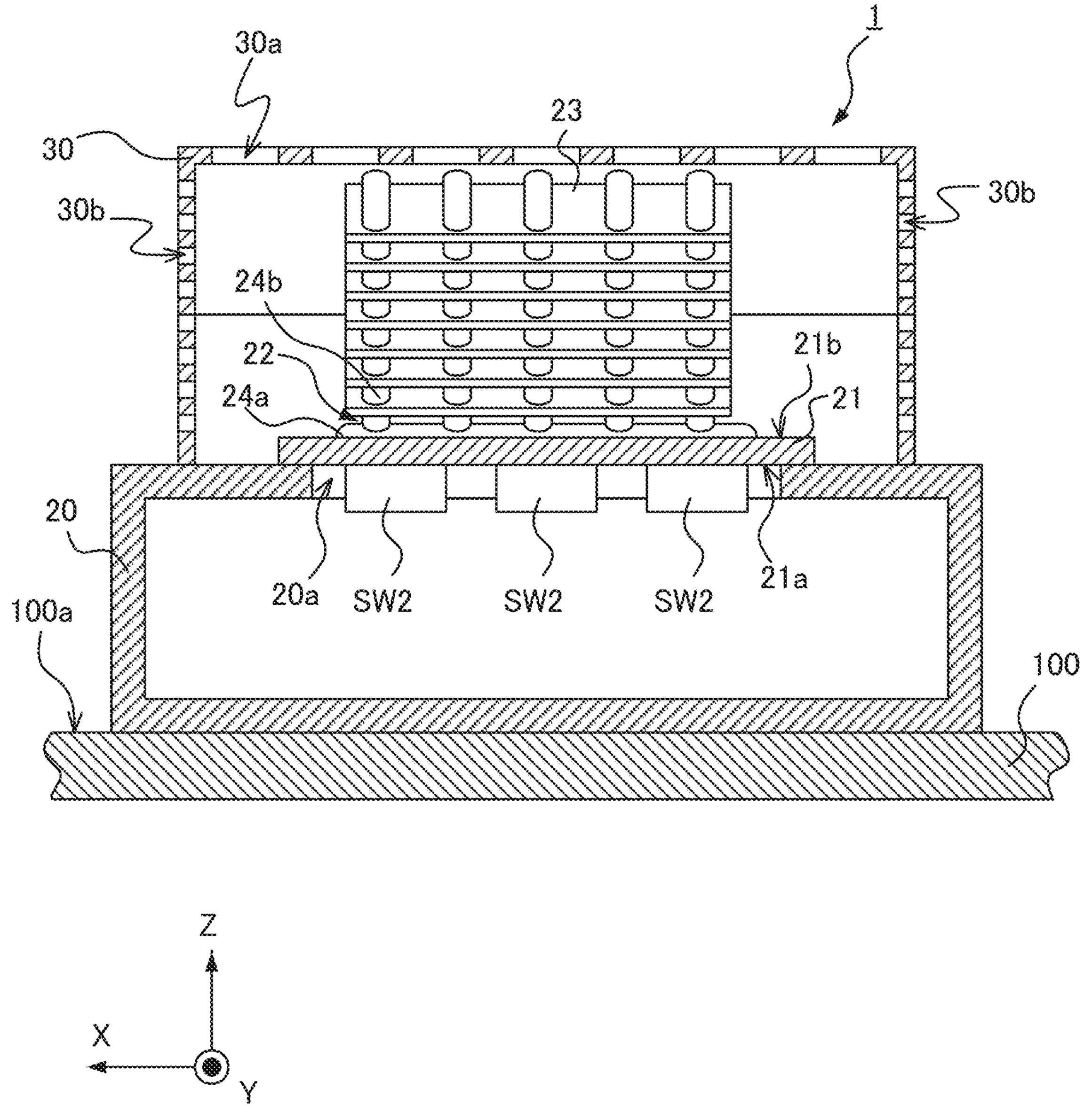
FIG. 4 is a cross-sectional view of the electronic device according to Embodiment 1 taken along line IV-IV as viewed in the direction indicated by the arrows in FIG. 3.

As illustrated in FIG. 3 and FIG. 4 that is a cross-sectional view taken along line IV-IV as viewed in the direction indicated by the arrows in FIG. 3, multiple headers 24*a* extending in X-direction are arranged in Y-direction. In Embodiment 1, eight headers 24*a* extending in X-direction are arranged in Y-direction. Each header 24*a* is received in a groove on the second main surface 21*b* of the heat-receiving block 21, and attached to the heat-receiving block 21 by, for example, bonding with an adhesive, welding, or soldering. Each header 24*a* is a pipe formed from a highly thermally conductive material including metal such as iron or aluminum. Each header 24*a* receives multiple branch pipes 24*b*.

When the vehicle 100 is traveling, airflow heated with heat transferred from the fins 23 at the front in the travel direction of the vehicle 100 flows rearward in the travel direction of the vehicle 100. Thus, the electronic device 1 may fail to sufficiently cool electronic components located at the rear in the travel direction of the vehicle 100 compared with electronic components located at the front in the travel direction of the vehicle 100. As described above, the headers 24*a* extending in X-direction and convection of the coolant in the headers 24*a* facilitate dispersion of heat in X-direction, and reduce variations in cooling the electronic components arranged in X-direction.

Each branch pipe 24*b* extends in Z-direction. Each branch pipe 24*b* is attached to the corresponding header 24*a* by, for example, welding or soldering and continuous with the header 24*a*. Each branch pipe 24*b* is a pipe formed from a highly thermally conductive material including metal such as iron or aluminum. Each branch pipe 24*b* has a dimension below a vehicle limit in the cross section taken perpendicular to the travel direction of the vehicle 100, or more specifically, a YZ plane. The vehicle limit indicates a maximum dimension of the vehicle 100. In Embodiment 1, the branch pipes 24*b* have different dimensions corresponding to the vehicle limit. More specifically, the dimension of the branch pipes 24*b* in Z-direction attached to the two headers 24*a* at two ends in Y-direction is shorter than the dimension of the branch pipes 24$b$ in Z-direction attached to the four headers 24$a$ at the center in Y-direction.

The fins 23 are attached to the heat transfer members 22. More specifically, the fins 23 are attached to the heat transfer members 22 to receive the heat transfer members 22 in through-holes in the fins 23. The fins 23 attached to the heat transfer members 22 dissipate heat transferred from the electronic components through the heat-receiving block 21 and the heat transfer members 22 into ambient air. In Embodiment 1, the fins 23 are plates of a highly thermally conductive material including metal such as iron or aluminum.

To enhance the cooling performance of the electronic components when the vehicle 100 is traveling, the main surfaces of the fins 23 is preferably parallel to X-axis. The airflow created by the traveling vehicle 100 flows in X-direction. Thus, the fins 23 having the main surfaces parallel to X-axis can efficiently transfer heat to airflow flowing between the fins 23. This structure can cool the electronic components including the switching elements SW1, SW2, and SW3.

To cool electronic components through natural convection when the vehicle 100 is stopped, the fins 23 are attached to the heat transfer members 22 with the main surfaces inclined with respect to the horizontal plane for the vehicle 100 located horizontally. The main surfaces inclined with respect to the horizontal plane refer to the main surfaces that are not parallel to the horizontal plane. The main surfaces of the fins 23 inclined with respect to the horizontal plane allow air heated with heat transferred from the fins 23 to move vertically upward along the fins 23. This airflow causes outside air to flow in, and transfers heat from the fins 23 to the inflow air. The main surfaces of the fins 23 inclined with respect to the horizontal plane cause this airflow and thus can cool the electronic components including the switching elements SW1, SW2, and SW3.

In Embodiment 1, the multiple fins 23 are arranged in Y-direction and Z-direction. As illustrated in FIG. 3, four fins 23 are arranged in Y-direction. The fins 23 at each end in Y-direction are four fins 23 arranged in Z-direction. The fins 23 at the center in Y-direction are seven fins 23 arranged in Z-direction. The fins 23 at the two ends in Y-direction are attached to the heat transfer members 22, or more specifically, to the branch pipes 24$b$ with one end 231 of each fin 23 nearer the center of the vehicle 100 in Y-direction located vertically higher than the other end 232 of each fin 23 for the vehicle 100 located horizontally. In other words, the fins 23 at the two ends in Y-direction are attached to the heat transfer members 22 to be higher toward the center in Y-direction, rather than being attached horizontally.

The fins 23 at the center in Y-direction are attached to the heat transfer members 22, or more specifically, to the branch pipes 24$b$ with one end 231 of each fin 23 nearer the center of the vehicle 100 in Y-direction located vertically lower than the other end 232 of each fin 23 for the vehicle 100 located horizontally. In other words, the fins 23 at the center in Y-direction are attached to the heat transfer members 22 to be higher toward the ends in Y-direction, rather than being attached horizontally.

The cover 30 is attached to the housing 20 to cover the heat-receiving block 21, the heat transfer members 22, and the fins 23. The cover 30 has multiple ventilation holes 30$a$ in a surface extending along X-axis. The ventilation holes 30$a$ allow outside air to flow into the cover 30, and allow air flowing near the heat transfer members 22 and the fins 23 to flow out of the cover 30. As illustrated in FIG. 4, the cover 30 has multiple ventilation holes 30$b$ in surfaces perpendicular to X-axis. The ventilation holes 30$b$ allow outside air to flow into the cover 30, and allow air flowing near the heat transfer members 22 and the fins 23 to flow out of the cover 30.

Cooling of electronic components of the electronic device 1 with the above structure is described below. Heat generated by at least one of the switching elements SW1, SW2, and SW3 is transferred to the coolant through the heat-receiving block 21 and the headers 24$a$. Thus, the coolant evaporates. The evaporated coolant moves in the branch pipes 24$b$ in the positive Z-direction. The coolant transfers heat to air around the heat transfer members 22 through the branch pipes 24$b$ and the fins 23 while moving in the positive Z-direction, and is cooled and liquefies. The liquefied coolant moves in the negative Z-direction along the inner walls of the branch pipes 24$b$. As described above, the coolant circulates while repeatedly evaporating and liquefying to transfer heat generated by at least one of the switching elements SW1, SW2, and SW3 to air around the heat transfer members 22, and to cool the switching elements SW1, SW2, and SW3 generating heat.

Figure 5:
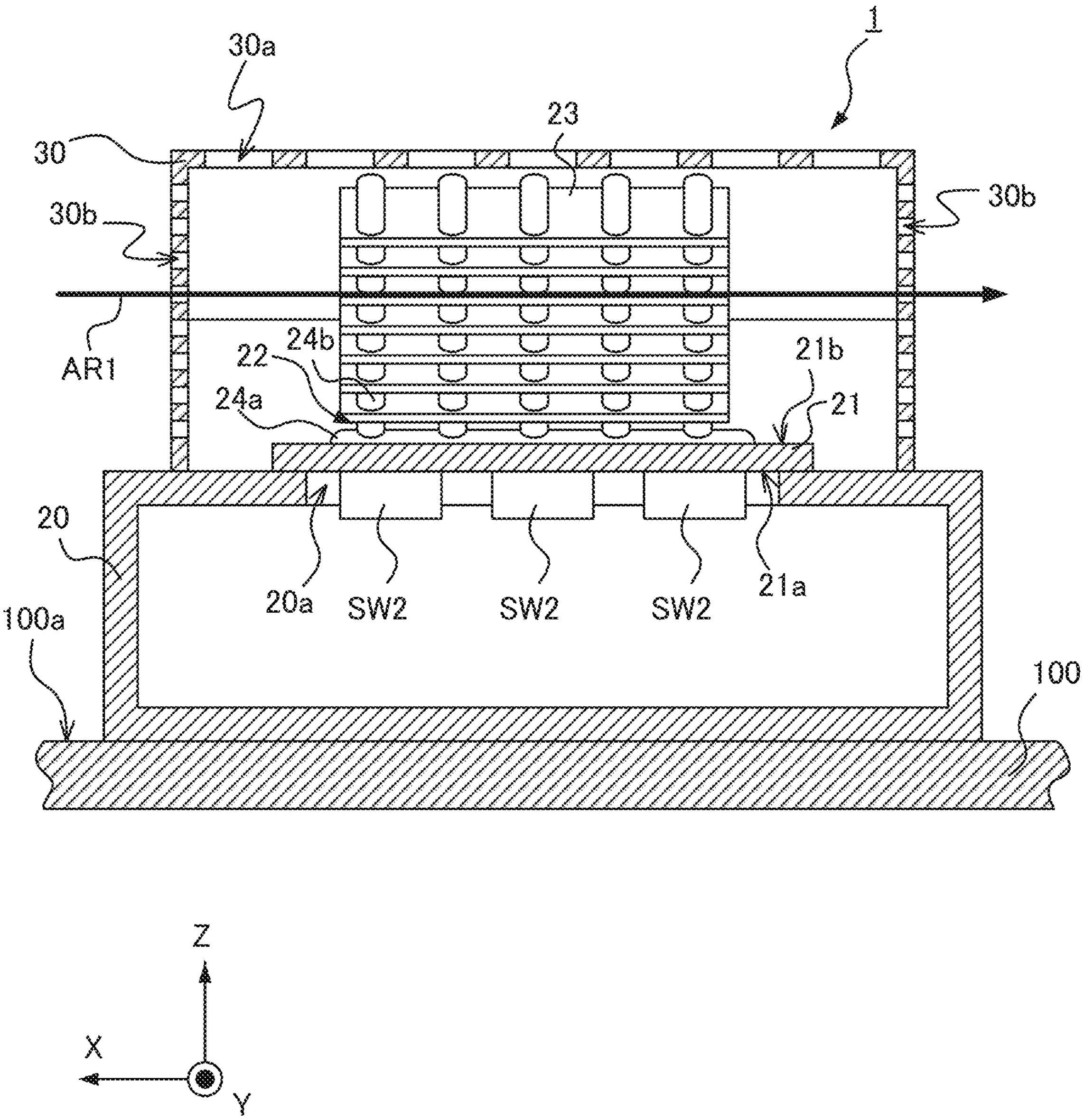
FIG. 5 is a diagram of the electronic device according to Embodiment 1, illustrating example airflow.

For example, when the vehicle 100 travels in the positive X-direction, airflow flowing in the negative X-direction as indicated by arrow AR1 in FIG. 5 occurs. For simplicity, FIG. 5 simply illustrates a part of airflow. The airflow flows between the fins 23. The airflow flowing between the fins 23 receives heat transferred from the fins 23 and cools the switching elements SW1, SW2, and SW3.

When the vehicle 100 is stopped, no airflow illustrated in FIG. 5 occurs. Air heated with heat transferred from the fins 23 has lower density than distant air at ordinary temperature, for example, air outside the cover 30. When buoyancy caused by the difference in air density exceeds the air viscous force, air flows around the fins 23. The ratio of the buoyancy to the viscous force in natural convection is expressed by the Grashof number Gr in Formula 1 below. Higher Grashof numbers Gr are more likely to cause natural convection.

$$Gr = \frac{g \cdot \beta \cdot \Delta T \cdot L^3}{\nu^2} \tag{1}$$

In Formula 1, g denotes gravitational acceleration (in $m/s^2$). β denotes the coefficient of cubical expansion (in 1/K) of a fluid, or more specifically, air. ΔT denotes a representative temperature difference, or more specifically, a temperature difference between a heating body and the fluid, or the temperature difference (in K) between the fins 23 and air. L denotes a representative dimension, or more specifically, a dimension of the heating body along airflow, for example, a dimension of the fins 23 along airflow in the YZ plane. ν denotes a coefficient of kinematic viscosity (in $m^2/s$) of a fluid, or more specifically, air.

Figure 6:
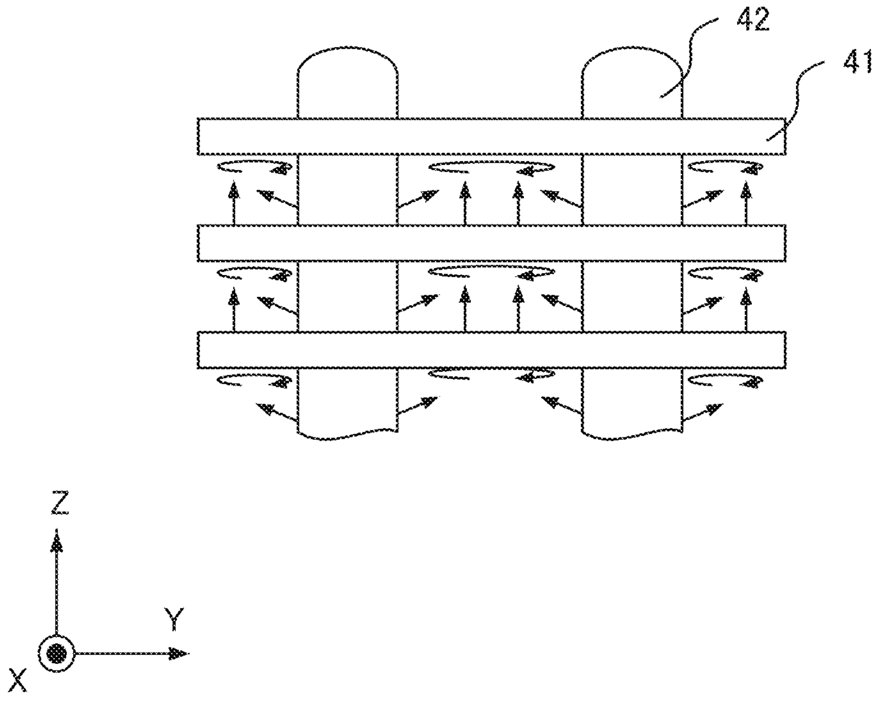
FIG. 6 is a diagram of fins located horizontally, illustrating example natural convection around the fins.

As illustrated in FIG. 6, in a known electronic device including fins 41 having the main surfaces horizontally attached to heat pipes 42 for the vehicle located horizontally, the dimension of the fins along airflow flowing vertically upward is the vertical dimension of the side surfaces of the fins that come in contact with air flowing vertically upward, and is thus sufficiently small. Thus, the Grashof number Gr is small. In other words, natural convection is less likely to occur. Although natural convection occurs slightly and transfers heat from the fins 41 located vertically downward or vertically lower portions of the heat pipes 42 to move air vertically upward, the fins 41 located horizontally at positions vertically upward interrupt air transfer. Thus, air stagnates as indicated by the arrows in FIG. 6 in spaces defined by the heat pipes 42 adjacent to one another in Y-direction and the fins 41 adjacent to one another in Z-direction. Thus, a known electronic device including the fins 41 having the main surfaces located horizontally has insufficient cooling performance through natural convection.

Figure 7:
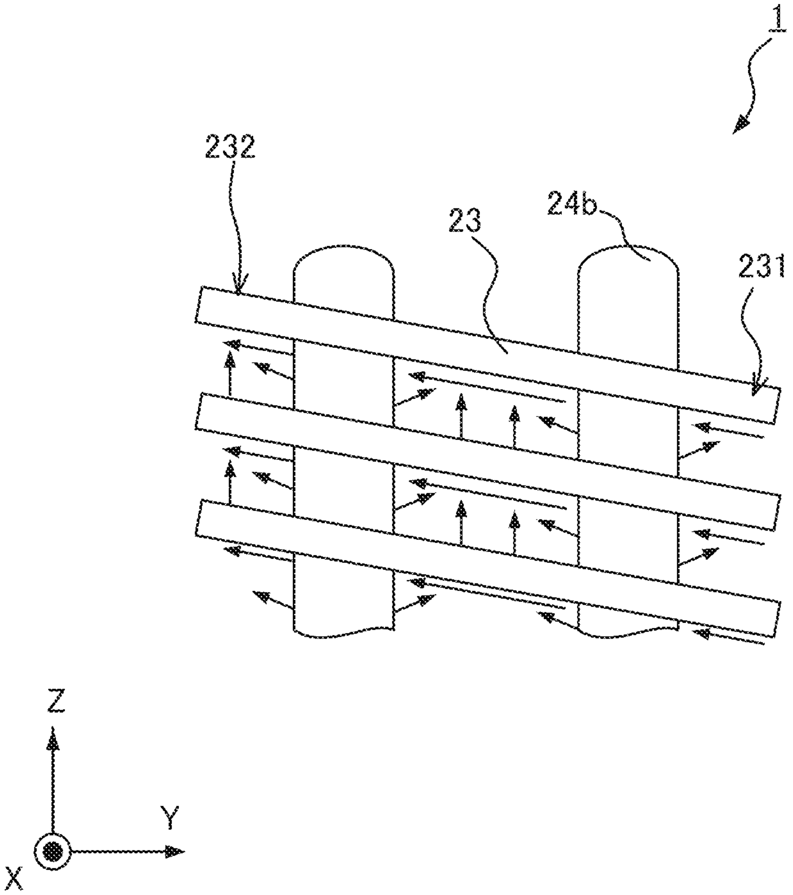
FIG. 7 is a diagram of the fins in Embodiment 1, illustrating example natural convection around the fins.

In the electronic device 1 according to Embodiment 1, in contrast, the fins 23 are attached to the heat transfer members 22 with the main surfaces inclined with respect to the horizontal plane. The electronic device 1 thus has a larger representative dimension L, and has a higher Grashof number Gr than a known electronic device including horizontally extending fins. In other words, the electronic device 1 is more likely to cause natural convection than a known electronic device including horizontally extending fins. As illustrated in FIG. 7, air that has received heat transferred from the fins 23 located vertically downward or vertically lower portions of the branch pipes 24*b* moves vertically upward, and further moves vertically upward along the fins 23 inclined with respect to the horizontal plane.

Figure 8:
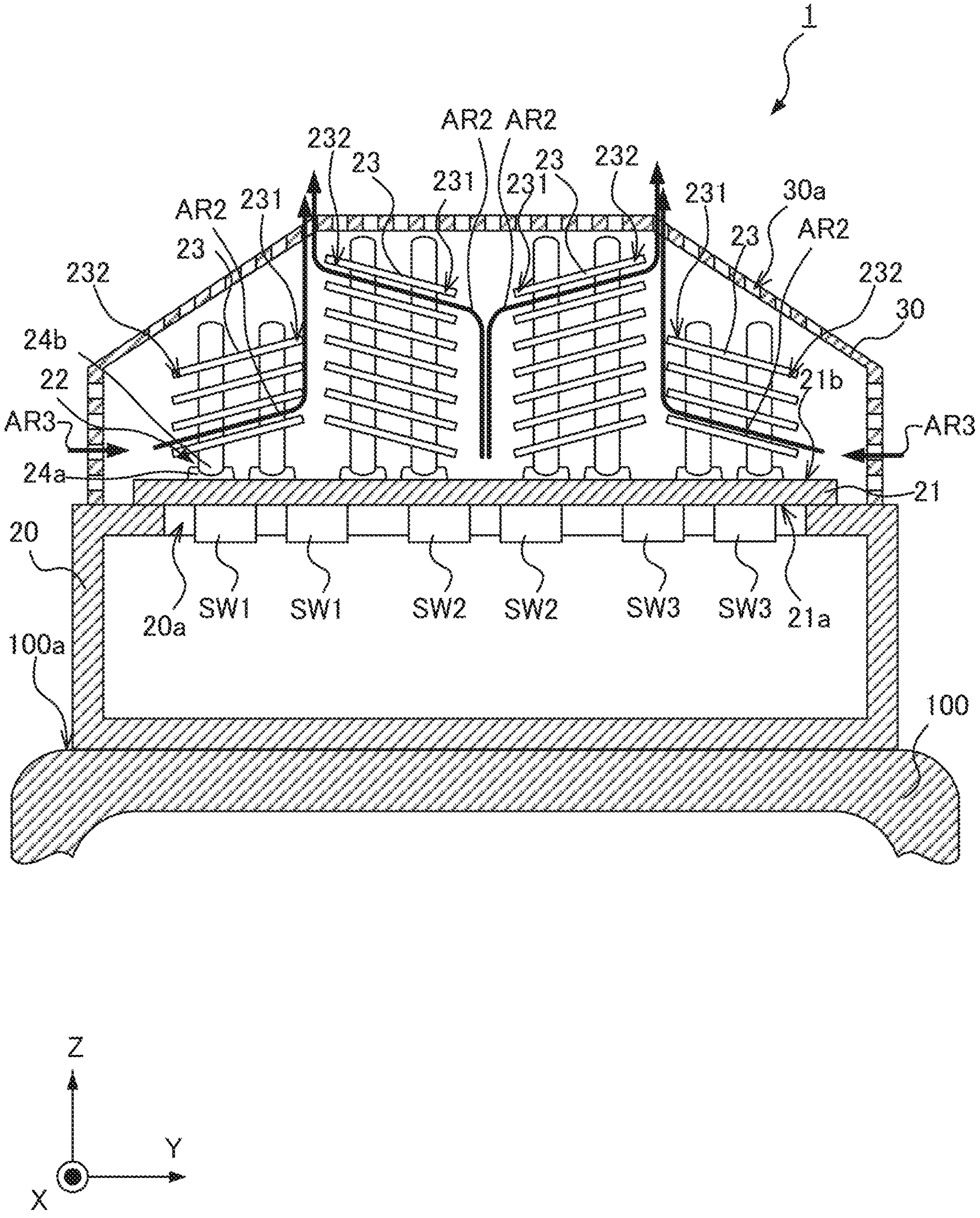
FIG. 8 is a diagram of the electronic device according to Embodiment 1, illustrating an example flow of natural convection.

Thus, as indicated by arrows AR2 in FIG. 8, air inside the cover 30 receives heat transferred from the fins 23 to be heated and moves vertically upward along the fins 23. Air moving vertically upward flows through the ventilation holes 30*a* in the vertically upper portion of the cover 30, and flows out of the cover 30. When air inside the cover 30 flows out through the ventilation holes 30*a*, air outside the cover 30 flows into the cover 30 through the ventilation holes 30*a* in the side surfaces of the cover 30 as indicated by arrows AR3. In addition, air outside the cover 30 flows into the cover 30 through the ventilation holes 30*b* not illustrated in FIG. 8. For simplicity, FIG. 8 simply illustrates a part of airflow.

As described above, air flowing into the cover 30 receives heat transferred from the fins 23 to be heated and moves vertically upward along the fins 23, and flows out of the cover 30 through the ventilation holes 30*a*. The fins 23 attached to the heat transfer members 22 with the main surfaces inclined with respect to the horizontal plane cause airflow moving vertically upward along the fins 23. The switching elements SW1, SW2, and SW3 can thus be cooled through natural convection in this manner also when the vehicle 100 is stopped.

As the angle between the main surfaces of the fins 23 and the horizontal plane increases for the vehicle 100 located horizontally, the representative dimension L in Formula 1 increases, and the Grashof number Gr also increases. Thus, the electronic device 1 enhances cooling performance through natural convection. However, when the angle between the main surfaces of the fins 23 and the horizontal plane increases for the vehicle 100 located horizontally, the dimension of each fin in Z-direction increases, and thus the electronic device 1 can install fewer fins 23 below the vehicle limit. The fewer fins 23 reduce the dissipation area and lower the cooling performance. Thus, the angle between the main surfaces of the fins 23 and the horizontal plane for the vehicle 100 located horizontally is preferably determined based on the cooling performance through natural convection and the space that can receive the fins 23.

In Embodiment 1, for example, the angle between the main surfaces of the fins 23 and the horizontal plane in the YZ plane for the vehicle 100 located horizontally is preferably within a range of less than or equal to 15 degrees. More specifically, the angle between the main surfaces of the fins 23 and the horizontal plane in the YZ plane is preferably within a range of 5 to 15 degrees inclusive.

As described above, the electronic device 1 according to Embodiment 1 includes the fins 23 attached to the heat transfer members 22 with the main surfaces inclined with respect to the horizontal plane for the vehicle 100 located horizontally. When the vehicle 100 is stopped, air heated with heat transferred from the fins 23 moves vertically upward along the fins 23. The fins 23 inclined with respect to the horizontal plane cause airflow moving vertically upward along the fins 23. Thus, the electronic device 1 can cool electronic components including the switching elements SW1, SW2, and SW3 through natural convection also when the vehicle 100 is stopped.

Embodiment 2

The electronic device 1 may be at any position, and the heat transfer members 22 and the fins 23 may be arranged in any manner other than in the above example to cool the electronic components through natural convection. In an example, an electronic device 2 according to Embodiment 2 includes heat transfer members 22 located in a container 100*b* on the roof 100*a* of the vehicle 100. The heat transfer members 22 extend at an acute angle with respect to the second main surface 21*b*.

Figure 9:
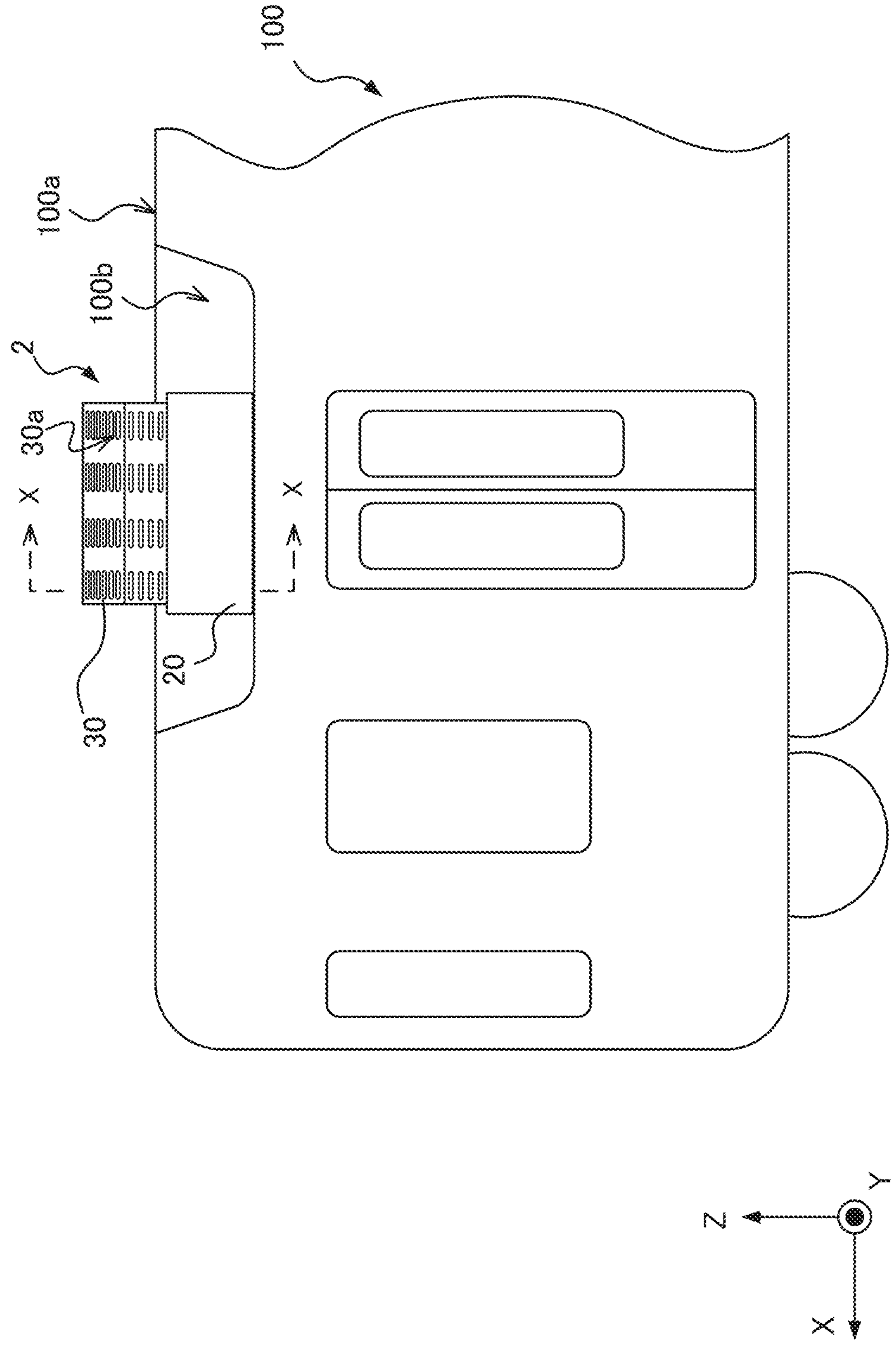
FIG. 9 is a diagram of an electronic device according to Embodiment 2, illustrating an example installation on a vehicle.

As illustrated in FIG. 9, the roof 100*a* of the vehicle 100 includes the container 100*b* being a recess that is open vertically upward. More specifically, the surface of the container 100*b* with the opening is flush with the vertically upper end of the roof 100*a* of the vehicle 100. The container 100*b* accommodates the housing 20 in the electronic device 2. More specifically, the bottom surface of the housing 20 is attached to the bottom surface of the container 100*b*.

To enhance the cooling performance, at least parts of the heat transfer members 22 and at least parts of the fins 23 are preferably located vertically above the upper end of the roof 100*a*.

Figure 10:
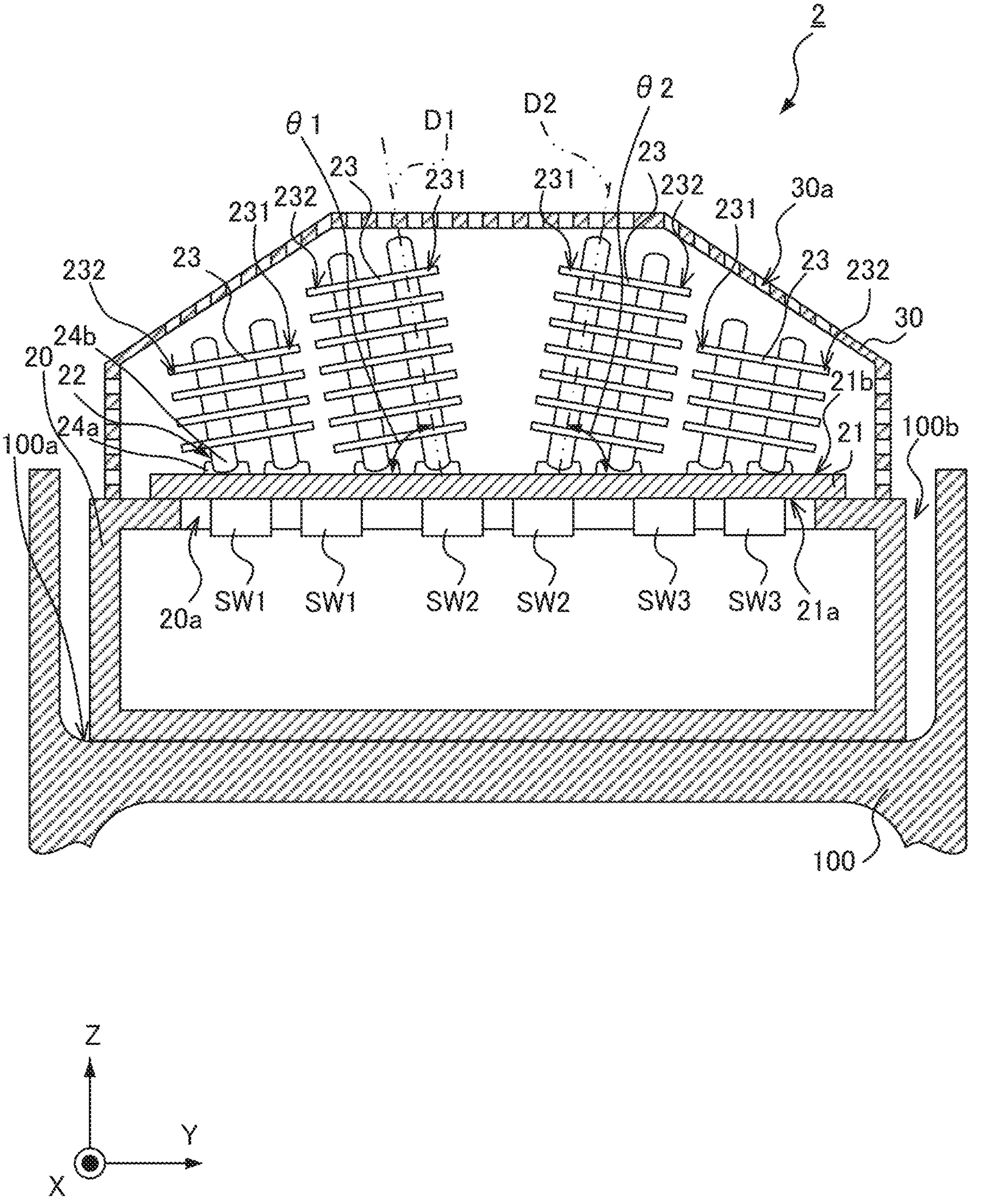
FIG. 10 is a cross-sectional view of the electronic device according to Embodiment 2 taken along line X-X as viewed in the direction indicated by the arrows in FIG. 9.

The electronic device 2 includes the same components as the electronic device 1 according to Embodiment 1, but differs from the electronic device 1 in the arrangement of the heat transfer members 22 and the fins 23. More specifically, as illustrated in FIG. 10 that is a cross-sectional view taken along line X-X as viewed in the direction indicated by the arrows in FIG. 9, the heat transfer members 22 extend at an acute angle with respect to the second main surface 21*b*. More specifically, each heat transfer member 22 includes headers 24*a* that are the same as the headers 24*a* in Embodiment 1, and branch pipes 24*b* attached to the headers 24*a* to extend at an acute angle with respect to the second main surface 21*b*. In Embodiment 2, each branch pipe 24*b* extends away from the second main surface 21*b* and extends from the center of the vehicle 100 in the width direction toward an end of the vehicle 100 in the width direction. FIG. 10 illustrates, with two-dot-dash lines, an extension direction D1 of the branch pipes 24*b* in the heat transfer members 22 located in the negative Y-direction from the center of the vehicle 100 in Y-direction and an extension direction D2 of the branch pipes 24*b* in the heat transfer members 22 located in the positive Y-direction from the center of the vehicle 100 in Y-direction. An angle $\theta 1$ between the extension direction D1 and the second main surface 21*b* and an angle $\theta 2$ between the extension direction D2 and the second main surface 21*b* are acute angles.

More specifically, eight headers 24*a* are attached to the second main surface 21*b* in Y-direction. The branch pipes 24*b* attached to the four headers 24*a* located in the negative Y-direction from the center of the second main surface 21*b* in Y-direction extend away from the second main surface 21*b* and extend in the negative Y-direction. The branch pipes 24*b* attached to the four headers 24*a* located in the positive Y-direction from the center of the second main surface 21*b* in Y-direction extend away from the second main surface 21*b* and extend in the positive Y-direction.

The fins 23 are attached to the heat transfer members 22 with the main surfaces inclined with respect to the horizontal plane for the vehicle 100 located horizontally. More specifically, the fins 23 are attached to the heat transfer members 22 with the main surfaces perpendicular to the extension direction of the branch pipes 24*b*. The heat transfer members 22 extend at an acute angle with respect to the second main surface 21*b*, and thus the main surfaces of the fins 23 perpendicular to the extension direction of the branch pipes 24*b* are inclined with respect to the second main surface 21*b*. The second main surface 21*b* extends horizontally for the vehicle 100 located horizontally. Thus, the main surfaces of the fins 23 are inclined with respect to the horizontal plane.

In Embodiment 2, each fin 23 has, in Y-direction, one end 231 nearer the center of the vehicle 100 located vertically higher than the other end 232.

When the vehicle 100 is traveling, as in Embodiment 1, airflow flows between the fins 23 to receive heat transferred from the fins 23 and cools the switching elements SW1, SW2, and SW3.

Figure 11:
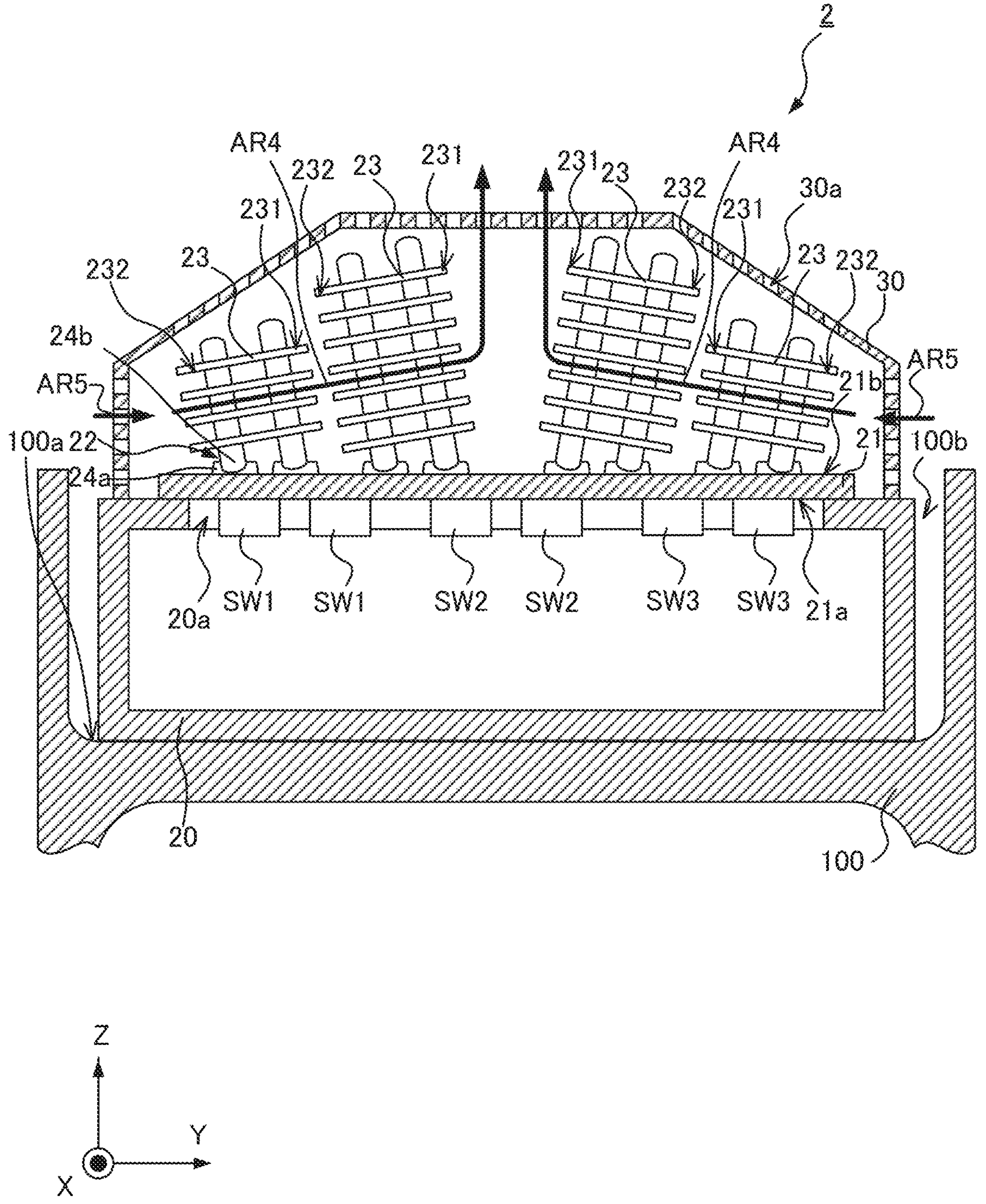
FIG. 11 is a diagram of the electronic device according to Embodiment 2, illustrating example natural convection.

When the vehicle 100 is stopped, no airflow occurs. As described above, the fins 23 are attached to the branch pipes 24*b* with the main surfaces perpendicular to the extension direction of the branch pipes 24*b* extending at an acute angle with respect to the second main surface 21*b*. Thus, as indicated by arrows AR4 in FIG. 11, air inside the cover 30 receives heat transferred from the fins 23 to be heated and moves vertically upward along the fins 23. Air moving vertically upward flows out of the cover 30 through the ventilation holes 30*a*. When the air inside the cover 30 flows out through the ventilation holes 30*a*, air outside the cover 30 flows into the cover 30 through the ventilation holes 30*a* as indicated by arrows AR5. In addition, air outside the cover 30 flows into the cover 30 through the ventilation holes 30*b* not illustrated in FIG. 11. For simplicity, FIG. 11 simply illustrates a part of airflow.

As described above, air flowing into the cover 30 receives heat transferred from the fins 23 to be heated and moves vertically upward along the fins 23, and flows out of the cover 30 through the ventilation holes 30*a*. The fins 23 attached to the branch pipes 24*b* cause airflow moving vertically upward along the fins 23, with the main surfaces perpendicular to the extension direction of the branch pipes 24*b* extending at an acute angle with respect to the second main surface 21*b*. The switching elements SW1, SW2, and SW3 can thus be cooled through natural convection also when the vehicle 100 is stopped.

As the acute angle between the extension direction of the branch pipes 24*b* and the second main surface 21*b* decreases, or in other words, as the angles θ1 and 02 in FIG. 10 decrease, the representative dimension L in Formula 1 increases, and the Grashof number Gr also increases. Thus, the electronic device 1 enhances cooling performance through natural convection. However, when the acute angle between the extension direction of the branch pipes 24*b* and the second main surface 21*b* decreases, the dimension of each branch pipe 24*b* in Z-direction increases. Thus, the electronic device 1 can install fewer branch pipes 24*b* below the vehicle limit. The fewer branch pipes 24*b* reduce the fins 23 attached to the branch pipes 24*b* below the vehicle limit. The fewer fins 23 reduce the dissipation area and lower the cooling performance. Thus, the acute angle between the extension direction of the branch pipes 24*b* and the second main surface 21*b* may be determined based on the cooling performance through natural convection and the space that can receive the fins 23.

For example, the acute angle between the extension direction of the branch pipes 24*b* and the second main surface 21*b* may be greater than or equal to 75 degrees. More specifically, the acute angle between the extension direction of the branch pipes 24*b* and the second main surface 21*b* may be 75 to 85 degrees inclusive.

As described above, the electronic device 2 according to Embodiment 2 includes the heat transfer members 22 that extend at an acute angle with respect to the second main surface 21*b*, and the fins 23 attached to the heat transfer members 22 with the main surfaces perpendicular to the extension direction of the heat transfer members 22. When the vehicle 100 is stopped, air heated with heat transferred from the fins 23 moves vertically upward along the fins 23. The fins 23 inclined with respect to the horizontal plane cause airflow moving vertically upward along the fins 23. Thus, the electronic device 2 can cool the electronic components including the switching elements SW1, SW2, and SW3 through natural convection also when the vehicle 100 is stopped.

Embodiment 3

The heat transfer members 22 may have any shape and the fins 23 may be located at any positions other than in the above examples to cool the electronic components with airflow and natural convection. An electronic device 3 according to Embodiment 3 includes heat transfer members and fins different from the heat transfer members and the fins in Embodiments 1 and 2 and is described focusing on the differences from the electronic devices 1 and 2.

Figure 12:
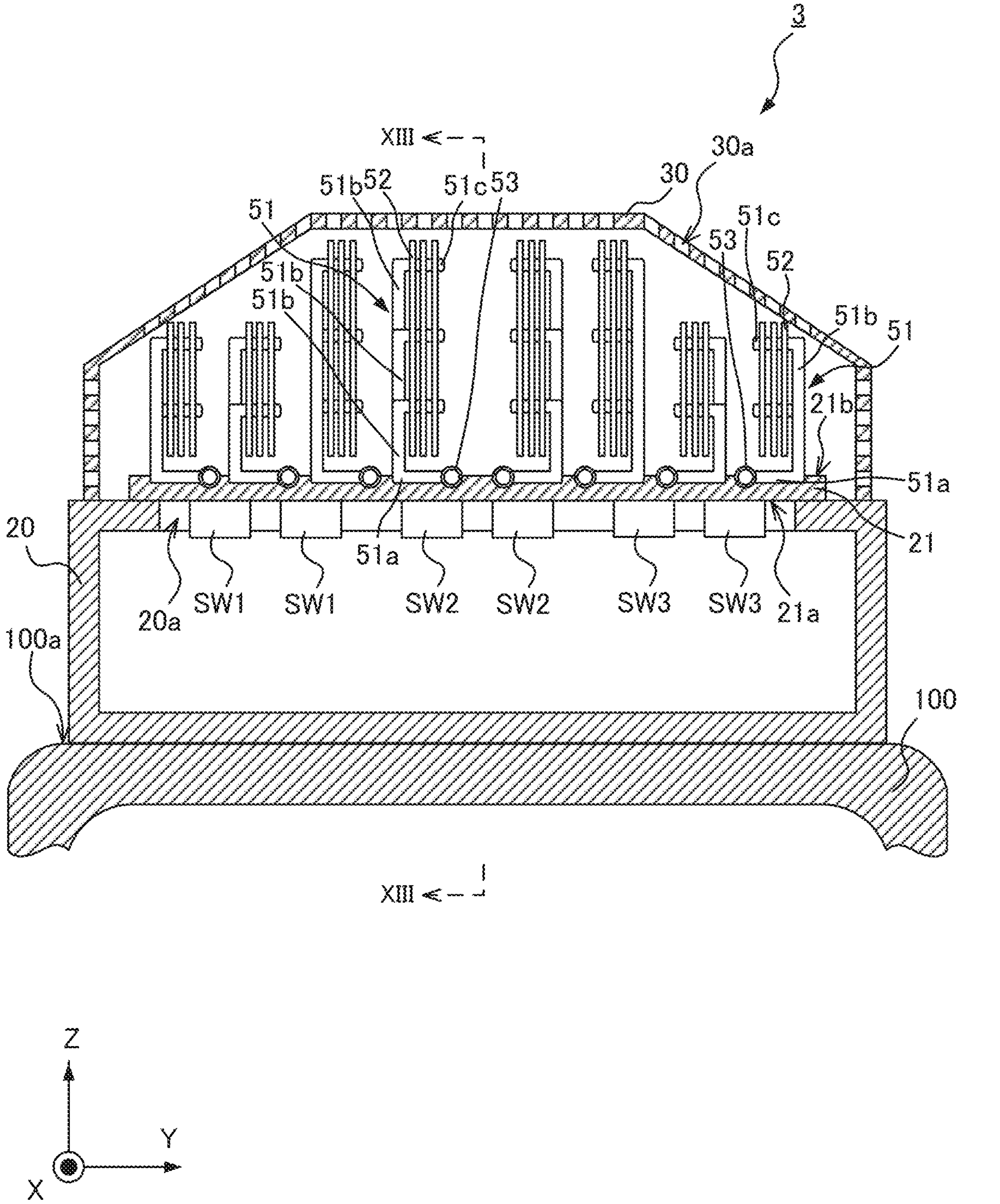
FIG. 12 is a cross-sectional view of an electronic device according to Embodiment 3.
Figure 13:
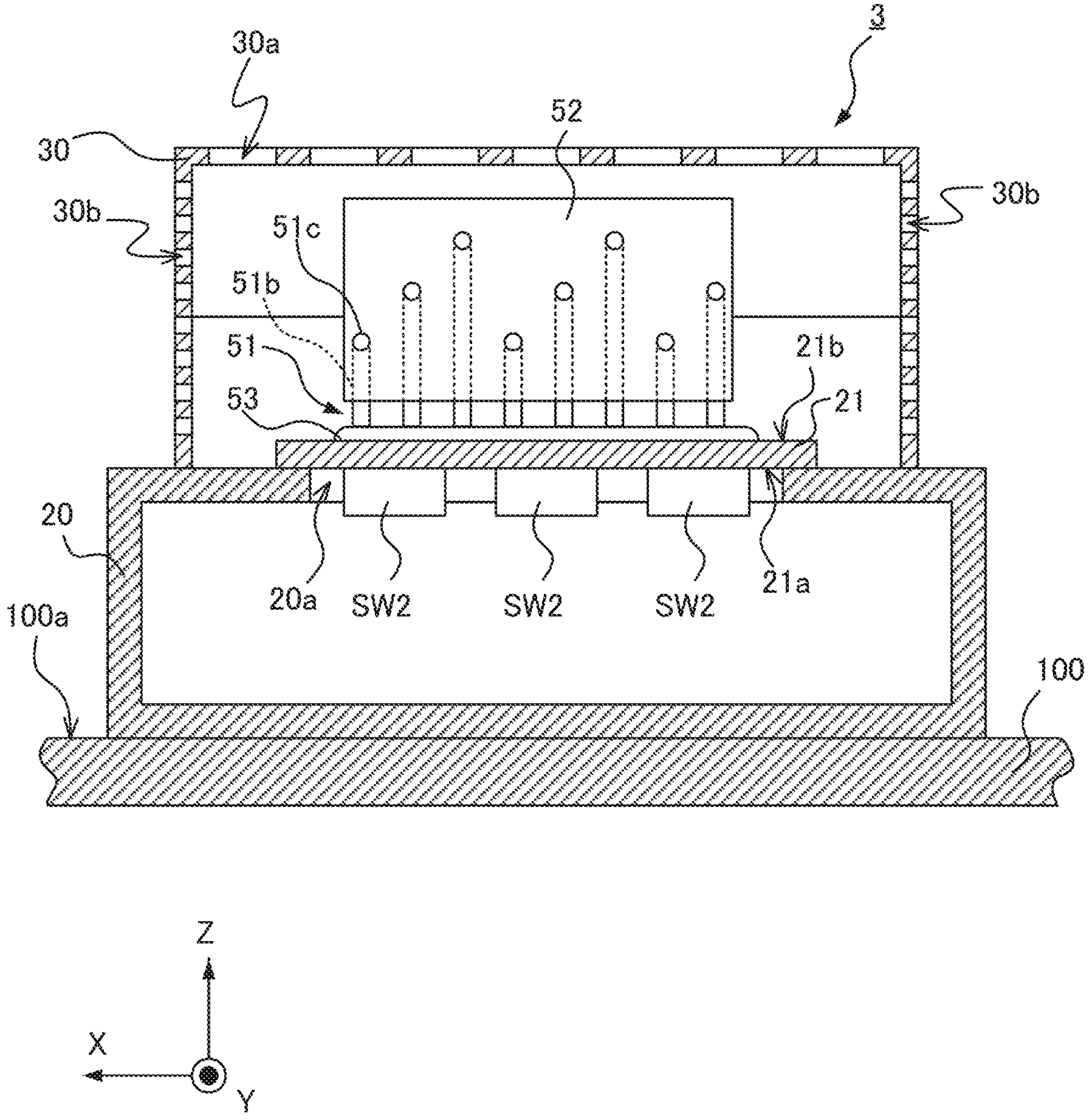
FIG. 13 is a cross-sectional view of the electronic device according to Embodiment 3 taken along line XIII-XIII as viewed in the direction indicated by the arrows in FIG. 12.

As illustrated in FIG. 12 and FIG. 13 that is a cross-sectional view taken along line XIII-XIII as viewed in the direction indicated by the arrows in FIG. 12, the electronic device 3 according to Embodiment 3 includes heat transfer members 51 attached to the heat-receiving block 21 to transfer heat transferred from the electronic components through the heat-receiving block 21 in a direction away from the second main surface 21*b*, and fins 52 attached to the heat transfer members 51 to dissipate heat transferred from the electronic components through the heat-receiving block 21 and the heat transfer members 51 into air. The heat transfer members 51 are arranged in X-direction and Y-direction. The fins 52 are arranged in Y-direction and attached to the heat transfer members 51.

The electronic device 3 may include heat dissipaters 53 extending in X-direction or the travel direction of the vehicle 100. The heat dissipaters 53 have the same function as the headers 24*a* in the heat transfer members 22 in the electronic device 1. For example, the heat dissipaters 53 are pipes formed from a highly thermally conductive material including metal such as iron or aluminum, and contain a coolant therein. The coolant is a substance in vapor and liquid phases at ordinary temperature, such as water.

Each heat transfer member 51 includes a base 51*a*, an extension 51*b* attached to the base 51*a*, and a holder 51*c* attached to the extension 51*b*. The base 51*a* extends in Y-direction, and is attached to the heat-receiving block 21 to be fully in contact with the heat-receiving block 21. For example, the base 51*a*, the extension 51*b*, and the holder 51*c* are pipes formed from a highly thermally conductive material including metal such as iron or aluminum, and continuous with one another. Thus, the base 51*a*, the extension 51*b*, and the holder 51*c* form a U-shaped heat pipe. The heat pipe including the base 51*a*, the extension 51*b*, and the holder 51*c* contains a coolant therein.

The bases 51*a* are received in grooves on the second main surface 21*b* of the heat-receiving block 21 and attached to the heat-receiving block 21 by, for example, bonding with an adhesive, or soldering. The bases 51*a* extend in the horizontal direction for the vehicle 100 located horizontally. The bases 51*a* in contact with the heat-receiving block 21 extend in Y-direction. Thus, heat is efficiently transferred from the heat-receiving block 21 to the coolant in the bases 51*a*. In Embodiment 3, each base 51*a* has one end continuous with the corresponding heat dissipater 53.

Each extension 51*b* has one end continuous with the other end of the corresponding base 51*a*. The extensions 51*b* extend in Z-direction, or more specifically, away from the heat-receiving block 21 to transfer heat in a direction away from the second main surface 21*b* of the heat-receiving block 21.

Each holder 51*c* is continuous with the other end of the corresponding extension 51*b* and extends away from the extension 51*b*. More specifically, the holders 51*c* extend along the second main surface 21*b*. In Embodiment 3, the holders 51*c* extend in the horizontal direction for the vehicle 100 located horizontally. The fins 52 are attached to the holders 51*c*. The holders 51*c* hold the attached fins 52.

The electronic device 3 according to Embodiment 3 includes different heat transfer members 51 including the extensions 51*b* with three different dimensions. The heat transfer members 51 adjacent to one another in X-direction include the extensions 51*b* with different dimensions.

Each fin 52 is attached to the holders 51*c* in the heat transfer members 51 with the main surface substantially perpendicular to the horizontal direction for the vehicle 100 located horizontally. In other words, the direction normal to the main surface of each fin 52 is substantially aligned with the horizontal direction for the vehicle 100 located horizontally. The main surface substantially perpendicular to the horizontal direction refers to the angle formed by the main surface and the horizontal plane being within a range of 80 to 100 degrees inclusive. As described above, when the fins 52 are attached to the heat transfer members 51, the main surface of each fin 52 is substantially aligned with the vertical direction for the vehicle 100 located horizontally. To enhance the performance of cooling electronic components when the vehicle 100 is traveling, the main surfaces of the fins 52 are preferably parallel to X-axis. In other words, the direction normal to the main surface of the vehicle 100 is preferably aligned with Y-direction.

The heat dissipaters 53 are arranged in Y-direction. More specifically, the heat dissipaters 53 are received in grooves on the second main surface 21*b* of the heat-receiving block 21 and attached to the heat-receiving block 21 by, for example, bonding with an adhesive, or soldering. Each heat dissipater 53 receives multiple bases 51*a*.

Cooling of electronic components of the electronic device 3 with the above structure is described below. Heat generated by at least one of the switching elements SW1, SW2, and SW3 is transferred to the coolant through the heat-receiving block 21 and the bases 51*a*. Thus, the coolant evaporates. The evaporated coolant moves in the extensions 51*b* in the positive Z-direction, and flows into the holders 51*c*. While moving in the above manner, the coolant is cooled by transferring heat to air around the heat transfer members 51 through the extensions 51*b* or the holders 51*c* and the fins 23, and liquefies. The liquefied coolant returns to the bases 51*a* along the inner walls of the holders 51*c* and the extensions 51*b*. As described above, the coolant circulates while repeatedly evaporating and liquefying to transfer heat generated by at least one of the switching elements SW1, SW2, and SW3 to air around the heat transfer members 51, and cools the switching elements SW1, SW2, and SW3 generating heat.

As in Embodiment 1, when the vehicle 100 is traveling, the airflow flows between the fins 52 to receive heat transferred from the fins 52 and cools the switching elements SW1, SW2, and SW3.

Figure 14:
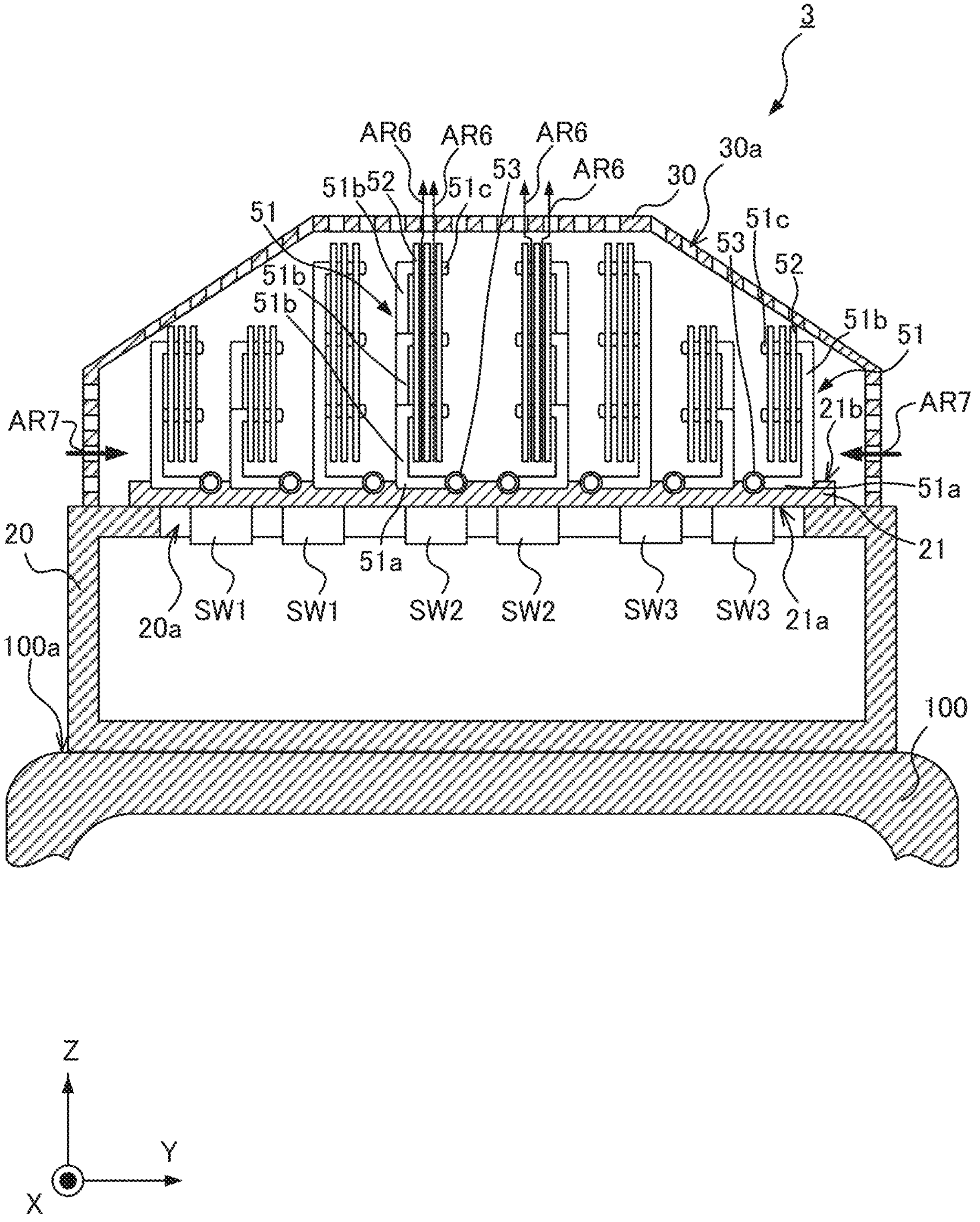
FIG. 14 is a diagram of the electronic device according to Embodiment 3, illustrating an example flow of natural convection.

When the vehicle 100 is stopped, no airflow occurs. As described above, the fins 52 are attached to the holders 51*c* in the heat transfer members 51 with the main surfaces perpendicular to the horizontal direction for the vehicle 100 located horizontally. Thus, as indicated by arrows AR6 in FIG. 14, air inside the cover 30 receives heat transferred from the fins 52 to be heated and moves in the positive Z-direction along the fins 52. Air moving in the positive Z-direction flows out of the cover 30 through the ventilation holes 30*a*. When air inside the cover 30 flows out through the ventilation holes 30*a*, air outside the cover 30 flows into the cover 30 through the ventilation holes 30*a* as indicated by arrows AR7. In addition, air outside the cover 30 flows into the cover 30 through the ventilation holes 30*b* not illustrated in FIG. 14. For simplicity, FIG. 14 simply illustrates a part of airflow.

As described above, air flowing into the cover 30 receives heat transferred from the fins 52 to be heated and moves vertically upward along the fins 52, and flows out of the cover 30 through the ventilation holes 30*a*. The fins 52 attached to the heat transfer members 51 with the main surfaces perpendicular to the horizontal direction for the vehicle 100 located horizontally cause airflow moving vertically upward along the fins 52. The switching elements SW1, SW2, and SW3 can thus be cooled through natural convection in this manner also when the vehicle 100 is stopped.

As described above, the electronic device 3 according to Embodiment 3 includes the fins 52 attached to the heat transfer members 51 with the main surfaces perpendicular to the horizontal direction for the vehicle 100 located horizontally. When the vehicle 100 is stopped, air heated with heat transferred from the fins 52 moves vertically upward along the fins 52. This causes airflow moving vertically upward along the fins 52. Thus, the electronic device 3 can cool the electronic components including the switching elements SW1, SW2, and SW3 through natural convection also when the vehicle 100 is stopped.

The heat transfer members 51 including the bases 51*a* in contact with the heat-receiving block 21 extending in Y-direction have higher efficiency of heat transfer from the heat-receiving block 21 to the heat transfer members 51 than in Embodiments 1 and 2. Thus, the electronic device 3 has high cooling performance.

The electronic device 3 including the heat dissipaters 53 dissipates heat transferred from the switching elements SW1, SW2, and SW3 through the heat-receiving block 21 in X-direction. Thus, the electronic device 3 suppresses variations in temperature of the heat-receiving block 21 in X-direction. Thus, the electronic device 3 can uniformly transfer heat to the heat transfer members 51 arranged in X-direction, and enhance cooling performance.

Embodiment 4

The heat transfer members 51 and the fins 52 may have any shapes other than in the examples in Embodiment 3. An electronic device 4 according to Embodiment 4 including heat transfer members 51 and fins 52 different from the heat transfer members 51 and the fins 52 in the electronic device 3 is described focusing on the differences from the electronic device 3.

Figure 15:
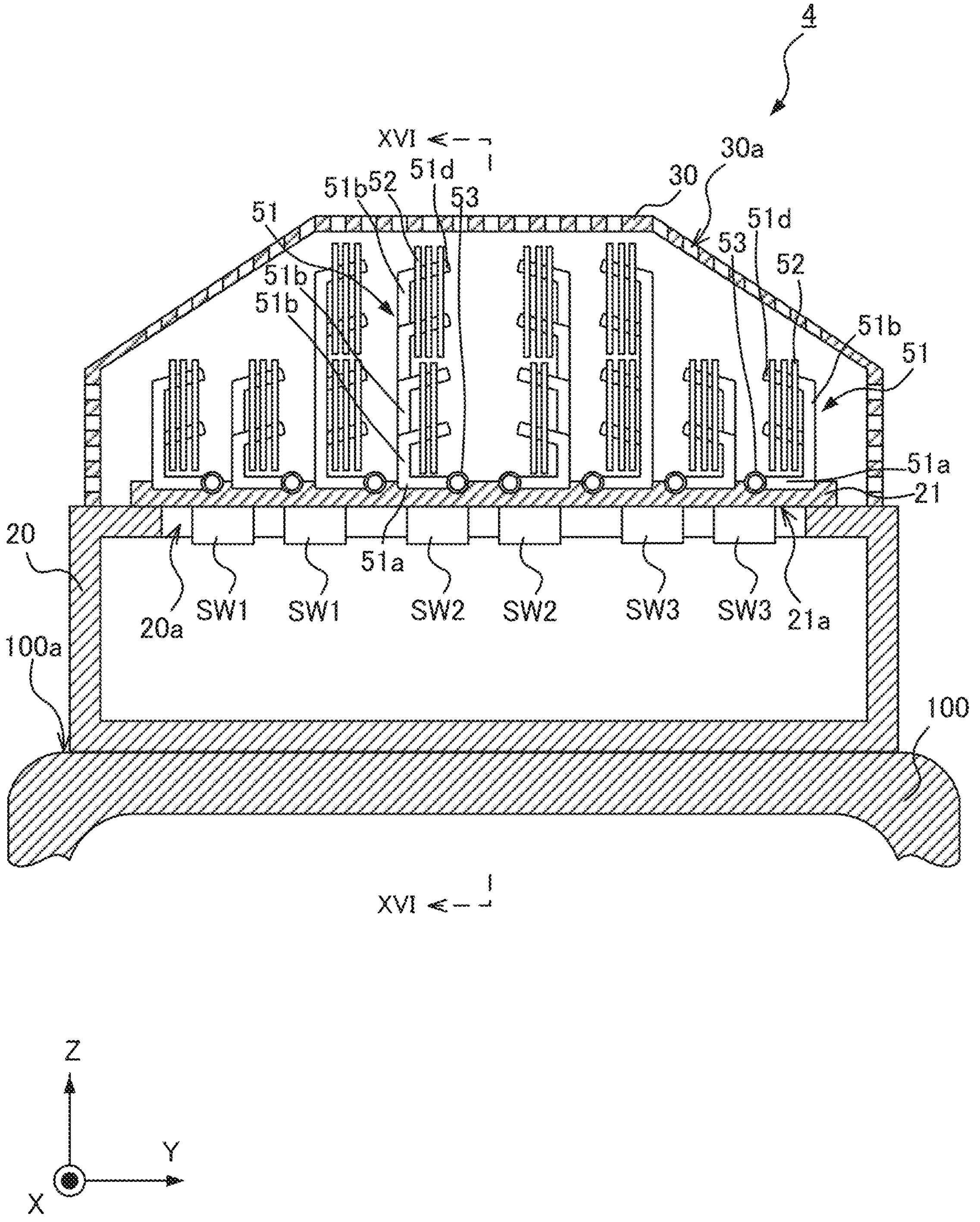
FIG. 15 is a cross-sectional view of an electronic device according to Embodiment 4.
Figure 16:
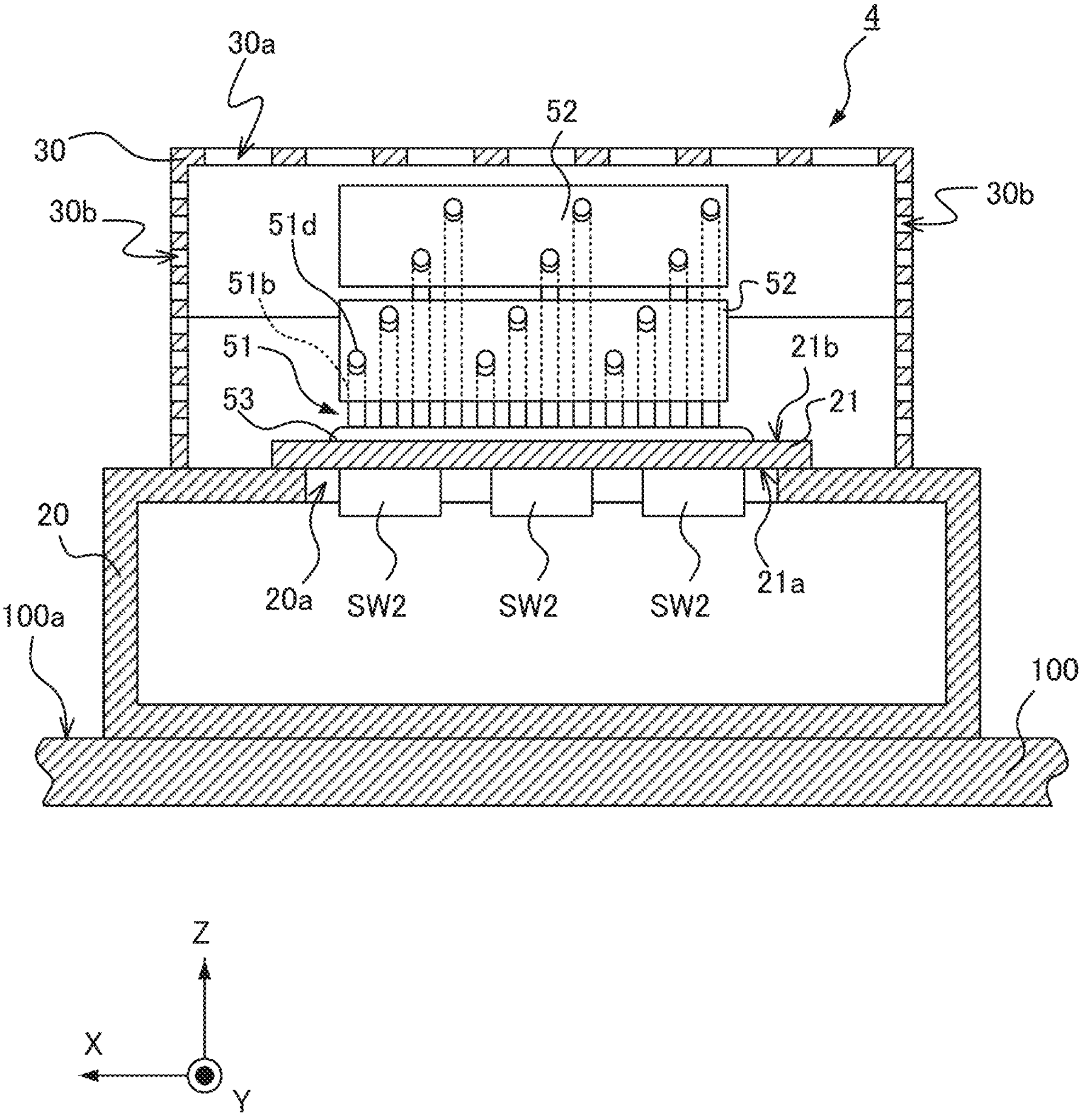
FIG. 16 is a cross-sectional view of the electronic device according to Embodiment 4 taken along line XVI-XVI as viewed in the direction indicated by the arrows in FIG. 15.

As illustrated in FIG. 15 and FIG. 16 that is a cross-sectional view taken along line XVI-XVI as viewed in the direction indicated by the arrows in FIG. 15, each heat transfer member 51 included in the electronic device 4 includes a base 51*a*, an extension 51*b*, and a holder 51*d*. The holder 51*d* has one end attached to the extension 51*b* at a position vertically lower than the other end. Thus, the coolant liquefied in the holder 51*d* more quickly reaches the extension 51*b* and the base 51*a* than the coolant in Embodiment 3. The electronic device 4 thus circulates the coolant more quickly, and has enhanced cooling performance.

The electronic device 4 according to Embodiment 4 includes different heat transfer members 51 including the extensions 51*b* with four different dimensions. The heat transfer members 51 adjacent to one another in X-direction include the extensions 51*b* with different dimensions.

As in Embodiment 3, each fin 52 is attached to the holders 51*d* in the heat transfer members 51 with the main surface perpendicular to the horizontal direction for the vehicle located horizontally. In Embodiment 4, at the center of the vehicle 100 in the width direction, the fins 52 are arranged in a direction away from the second main surface 21*b* of the heat-receiving block 21. In other words, the fins 52 are arranged in Z-direction at the center of the vehicle 100 in Y-direction. More specifically, as illustrated in FIG. 15, the fins 52 arranged in Y-direction and Z-direction are attached to the heat transfer members 51 attached to the four heat dissipaters 53 located at the center in Y-direction.

As in Embodiment 3, the coolant contained in the heat transfer members 51 circulates while repeatedly evaporating and liquefying to transfer heat generated by at least one of the switching elements SW1, SW2, and SW3 to air around the heat transfer members 51 and cools the switching elements SW1, SW2, and SW3 generating heat.

When the vehicle 100 is traveling, airflow flows between the fins 52 as in Embodiment 1 to receive heat transferred from the fins 52 and cools the switching elements SW1, SW2, and SW3. When the fins 52 are arranged in Z-direction, the airflow also flows between the fins 52 adjacent to one another in Z-direction. Thus, the fins 52 in the electronic device 4 have an area that comes in contact with the airflow larger than the area in the electronic device according to Embodiment 3. Thus, the electronic device 4 has enhanced cooling performance.

When the vehicle 100 is stopped, no airflow occurs. As in Embodiment 3, air inside the cover 30 receives heat transferred from the fins 52 to be heated and moves in the positive Z-direction along the fins 52. When the airflow flows in the positive Z-direction along the fins 52, a laminar boundary layer is formed near the fins 52. When the airflow flows in the positive Z-direction, the velocity gradient at the surfaces of the fins 52 decreases in the positive Z-direction, and the boundary layer may separate at the position where the velocity gradient is 0, or more specifically, at the separation point. The separation of the boundary layer causes airflow in a direction away from the fins 52, and interrupts air flowing near the fins 52.

To suppress separation of the boundary layer, at least one of the fins 52 arranged in Z-direction is preferably displaced in Y-direction from the other fins 52 adjacent in Z-direction. More specifically, as illustrated in FIG. 15, the multiple fins 52 attached to the heat transfer members 51 attached to the two heat dissipaters 53 located at the center in Y-direction may be located at different positions in Y-direction. When the fins 52 are displaced in Y-direction, and air that has received heat transferred from the fins 52 located downward in Z-direction moves in the positive Z-direction when the vehicle 100 is stopped, the air comes in contact with another one of the fins 52 and causes turbulence. The turbulence suppresses separation of the boundary layer near the fins 52 and allows air to flow near the fins 52. Thus, airflow occurs near the fins 52, and the electronic device 4 has enhanced cooling performance.

As described above, the holder 51*d* included in each heat transfer member 51 included in the electronic device 4 according to Embodiment 4 has one end attached to the extension 51*b* at a position vertically lower than the other end. Thus, the liquefied coolant can quickly return to the base 51*a* through the extension 51*b*, and the electronic device 4 has higher cooling performance than the electronic device 3.

When the fins 52 adjacent to one another in Z-direction are displaced from one another in Y-direction, separation of the boundary layer near the fins 52 is suppressed. Thus, the electronic device 4 has enhanced cooling performance.

The present disclosure is not limited to the above embodiments. For example, the embodiments may be combined as appropriate.

The inverter 14 may supply power to any load, other than the air-conditioning device 62, that operates when the vehicle 100 is stopped. In an example, the inverter 14 can supply power to a lighting device or a door opening/closing device in the vehicle 100.

Figure 17:
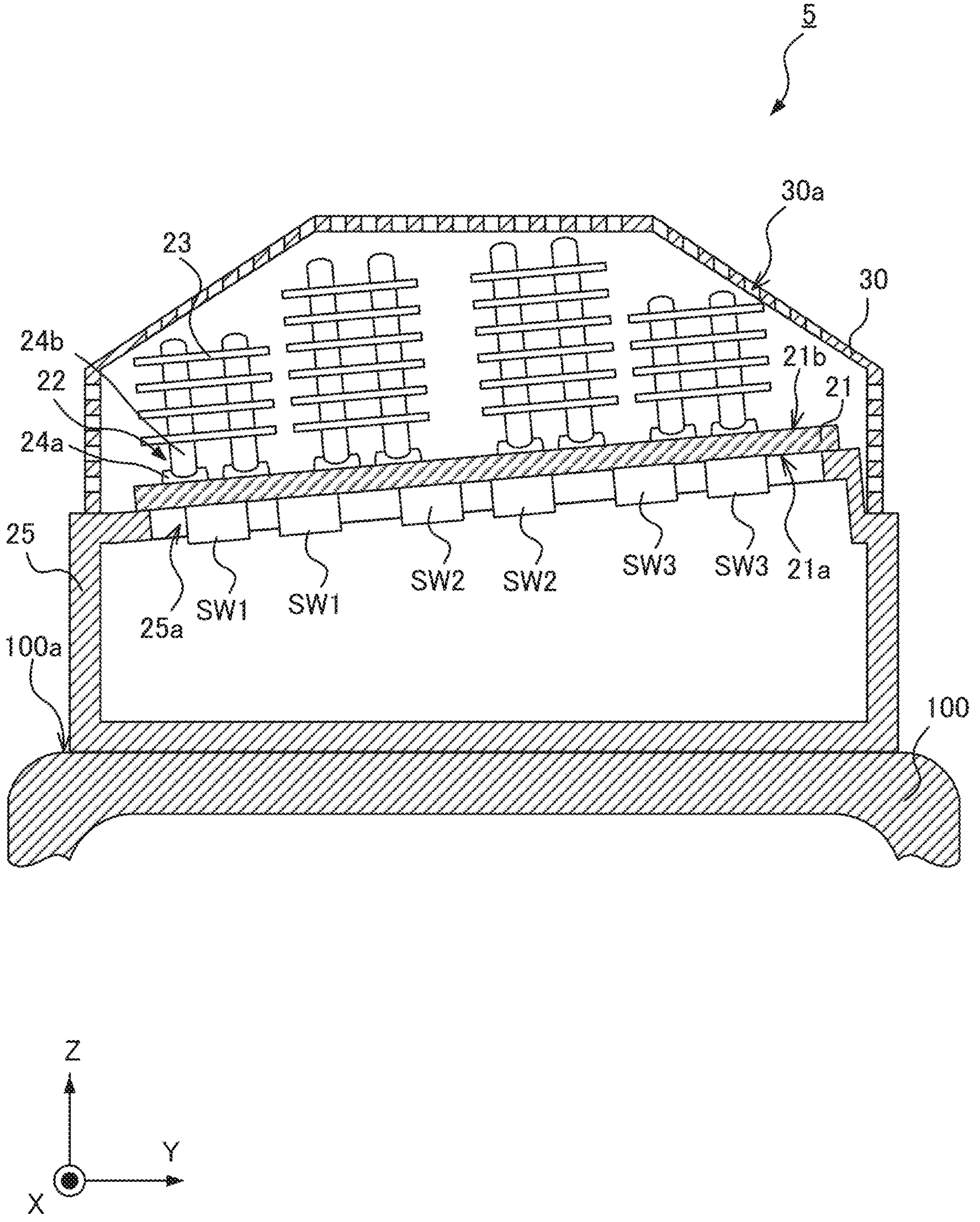
FIG. 17 is a cross-sectional view of an electronic device according to a first modification of an embodiment.

The housing 20 may have any shape that can accommodate electronic components including the switching elements SW1, SW2, and SW3 and that is attachable to the roof 100*a*. In an example, the vertically upper surface of a housing 25 in an electronic device 5 illustrated in FIG. 17 is inclined with respect to the horizontal plane for the vehicle 100 located horizontally. More specifically, for the vehicle 100 located horizontally, the surface with an opening 25*a* is inclined with respect to the horizontal plane.

As described above, the second main surface 21*b* of the heat-receiving block 21 that covers the opening 25*a* inclined with respect to the horizontal plane is inclined with respect to the horizontal plane for the vehicle 100 located horizontally. In this case, the heat transfer members 22 may extend perpendicular to the second main surface 21*b*. Thus, the heat transfer members 22 extend at an acute angle with respect to the horizontal plane. More specifically, the branch pipes 24*b* are attached to the headers 24*a* so as to extend in a direction perpendicular to the second main surface 21*b*.

In this case, the fins 23 may be attached to the heat transfer members 22 with the main surfaces perpendicular to the extension direction of the heat transfer members 22. More specifically, the fins 23 may be attached to the branch pipes 24*b* with the main surfaces perpendicular to the extension direction of the branch pipes 24*b*. The heat transfer members 22 extend at an acute angle with respect to the horizontal plane, and the main surfaces of the fins 23 are inclined with respect to the horizontal plane. Thus, when the vehicle 100 is stopped, airflow vertically upward along the fins 23 occurs, and the electronic components including the switching elements SW1, SW2, and SW3 can be cooled through natural convection.

The heat-receiving block 21 may be a plate having a curved surface protruding away from the housing 20. In this case, the heat transfer members 22 may extend at an acute angle with respect to the horizontal plane for the vehicle 100 located horizontally.

Figure 18:
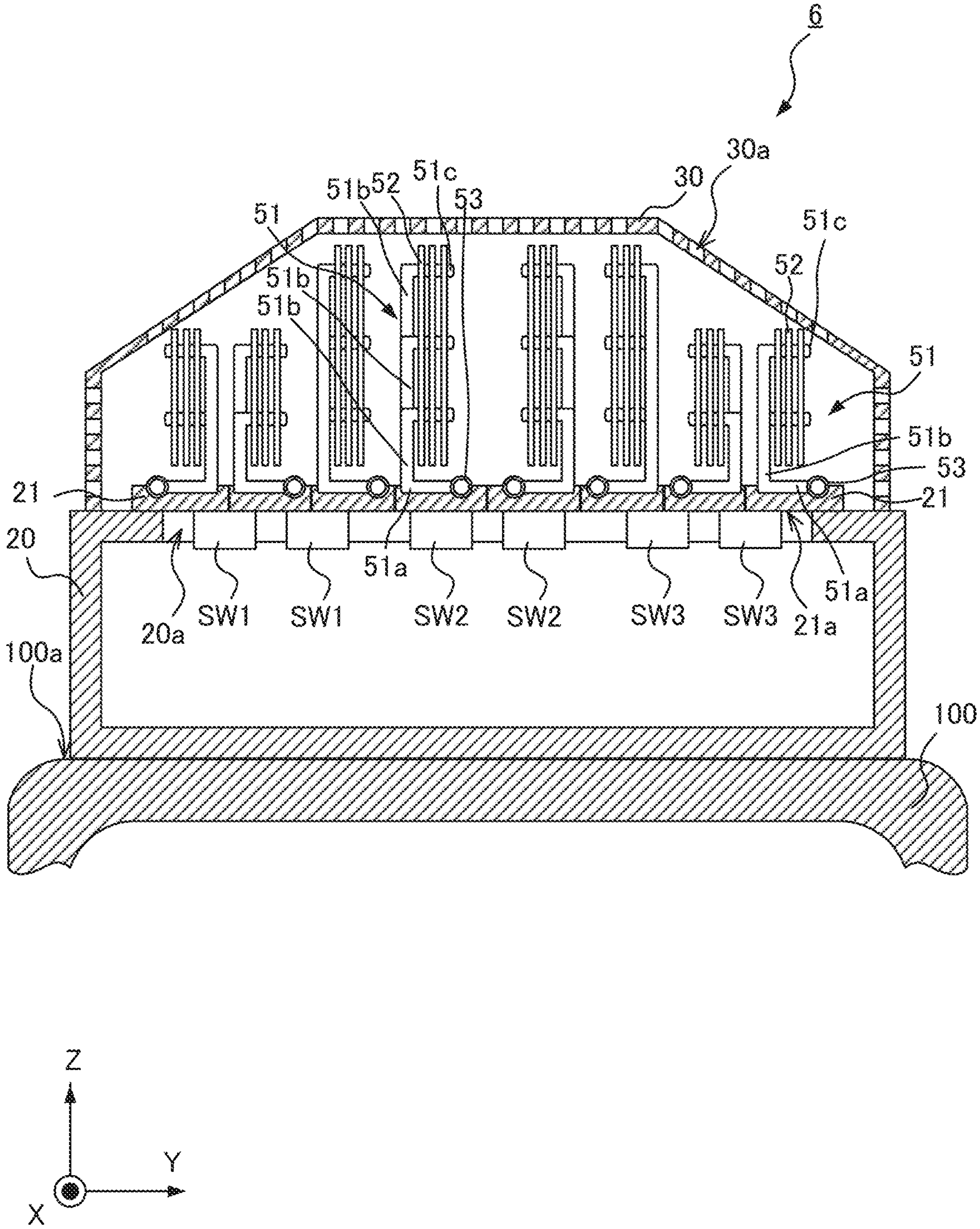
FIG. 18 is a cross-sectional view of an electronic device according to a second modification of an embodiment.

The heat-receiving block 21 may be a single plate as described in the above embodiments, or a combination of multiple plates. FIG. 18 illustrates an electronic device 6 including multiple heat-receiving blocks 21. The electronic device 6 includes the multiple heat-receiving blocks 21 and heat transfer members 51 attached to the heat-receiving blocks 21. Each heat transfer member 51 has the same structure as the heat transfer member 51 in the electronic device 3 according to Embodiment 3. The heat-receiving blocks 21 in contact with each other are attached to the housing 20 to cover the opening 20*a*. Each heat transfer member 51 is attached to the corresponding heat-receiving block 21. Thus, when any of the heat transfer members 51 has a defect, the heat transfer member 51 with the defect can be simply replaced. This structure facilitates maintenance and reduces maintenance costs.

Electronic components attached to the heat-receiving block 21 may be, for example, any electronic components, other than the switching elements SW1, SW2, and SW3, that are accommodated in the housing 20 or 25 such as a thyristor or a diode.

The heat transfer members 22 and 51 may not be heat pipes but may be formed from any material that transfers heat in a direction away from the second main surface 21*b*. For example, the heat transfer members 22 or 51 may be rod-like members formed from a highly thermally conductive material including metal such as iron or aluminum.

The heat transfer members 22 and 51 may be arranged in any manner other than in the above examples to cool the electronic components through natural convection. More specifically, in Embodiments 3 and 4, the holders 51*c* and 51*d* extend from the extension 51*b* toward the center of the vehicle 100 in the width direction, but may extend in another direction. In an example, as in one of the holders 51*c* in the heat transfer members 51 in the electronic device 6 illustrated in FIG. 18 at the end in the width direction of the vehicle 100, or in other words, the holder 51*c* in the heat transfer member 51 at the end in Y-direction, the holder 51*c* may extend from the extension 51*b* to the end of the vehicle 100 in the width direction.

Figure 19:
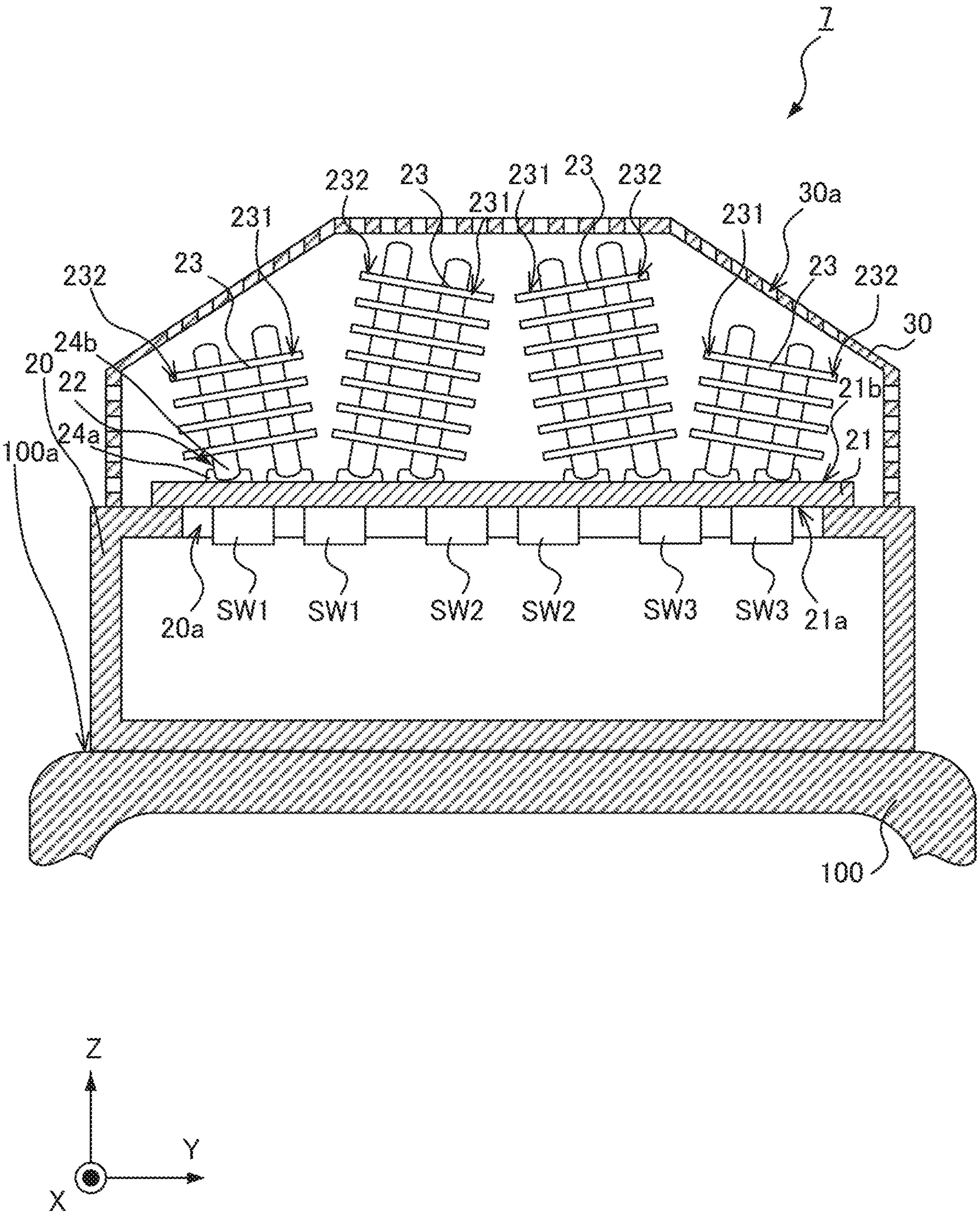
FIG. 19 is a cross-sectional view of an electronic device according to a third modification of an embodiment.

In another example, as in an electronic device 7 illustrated in FIG. 19, the branch pipes 24*b* nearer the end of the vehicle 100 in Y-direction may extend away from the second main surface 21*b* and extend toward the end of the vehicle 100 in Y-direction. The branch pipes 24*b* nearer the center of the vehicle 100 in Y-direction may extend away from the second main surface 21*b* and extend toward the center in Y-direction.

More specifically, in the electronic device 7, the two branch pipes 24*b* nearer the end of the vehicle 100 in the negative Y-direction extend away from the second main surface 21*b* and extend in the negative Y-direction. The two branch pipes 24*b* nearer the end of the vehicle 100 in the positive Y-direction extend away from the second main surface 21*b* and extend in the positive Y-direction. Of the four branch pipes 24*b* located at the center in Y-direction, the two branch pipes 24*b* located in the negative Y-direction extend away from the second main surface 21*b* and extend in the positive Y-direction. Of the four branch pipes 24*b* located at the center in Y-direction, the two branch pipes 24*b* located in the positive Y-direction extend away from the second main surface 21*b* and extend in the negative Y-direction.

As described above, each branch pipe 24*b* included in the electronic device 7 extends at an acute angle with respect to the second main surface 21*b*. As in Embodiment 1, the fins 23 are attached to the branch pipes 24*b* with the main surfaces perpendicular to the extension direction of the branch pipes 24*b*. Thus, the main surfaces of the fins 23 are inclined with respect to the horizontal plane. Thus, airflow vertically upward occurs to cool the electronic components including the switching elements SW1, SW2, and SW3.

The headers 24*a* and the branch pipes 24*b* may have any shape, other than in the above examples, that transfers heat in a direction away from the second main surface 21*b*. In an example, the header 24*a* and the branch pipe 24*b* may be integral with each other to form a U-shaped or L-shaped heat pipe as the heat transfer member 22.

When taken perpendicular to the extension direction, each heat transfer member 22 or 51 may have an elongated circular cross section rather than a circular cross section. The elongated circular shape is acquired by deforming a circle to narrow a part of the dimension, and includes an ellipse, a streamline shape, and an oval. The oval refers to an outline of perimeters of two circles with the same diameter connected with two straight lines.

Figure 20:
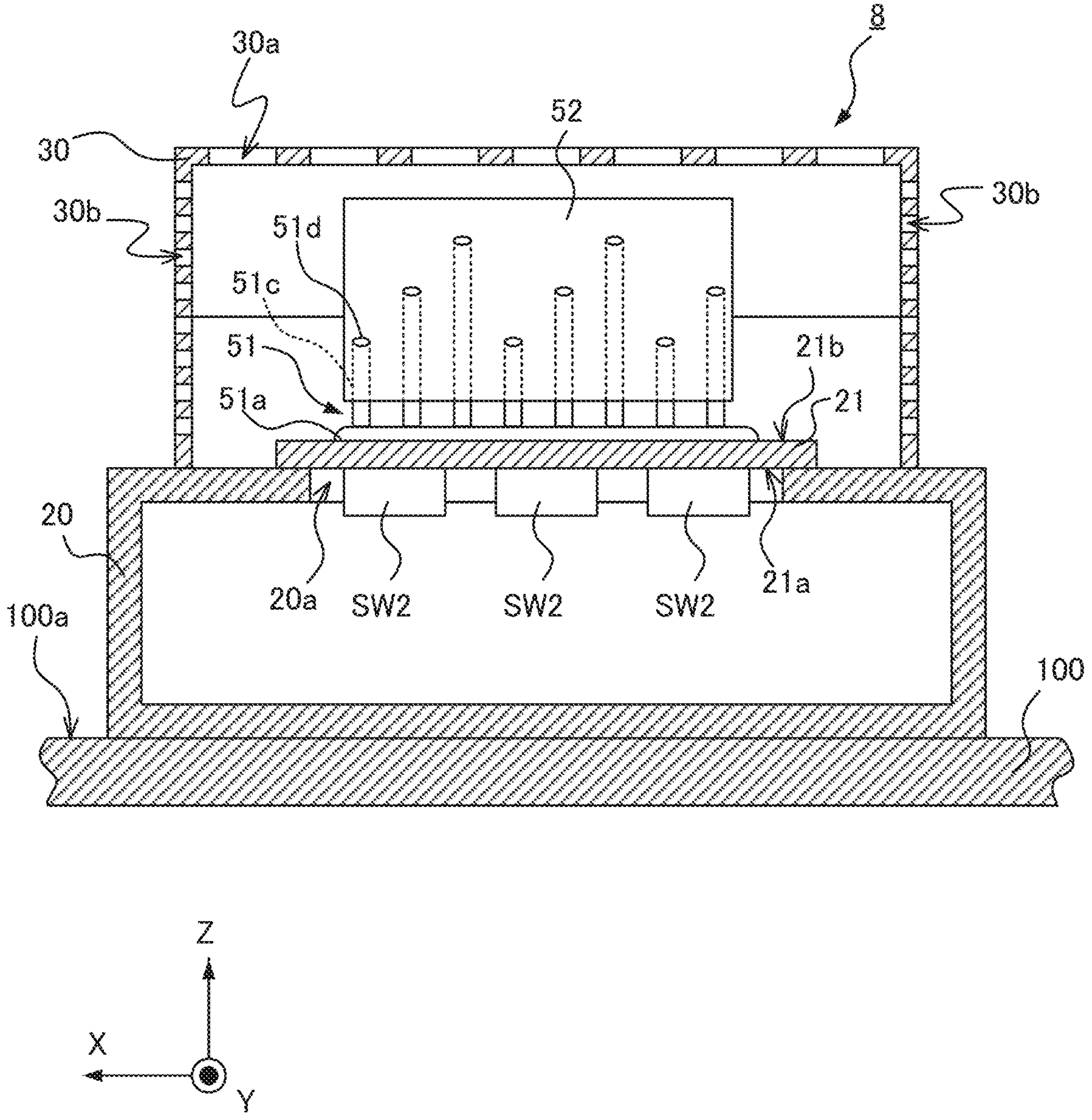
FIG. 20 is a cross-sectional view of an electronic device according to a fourth modification of an embodiment.

In an example, FIG. 20 illustrates an electronic device 8 including heat transfer members 51 including holders 51*c* with elliptic cross sections. When the cross-sectional areas are the same, the holders 51*c* with an elliptic cross section have a greater surface area than the holders 51*c* with a circular cross section. Thus, the electronic device 8 has higher cooling performance than the structure including the holders 51*c* with a circular cross section independently of whether the vehicle 100 is traveling or stopped. The electronic device 8 also produces the same effects when the heat transfer members 22 each have an elongated circular cross section taken perpendicular to the extension direction.

Figure 21:
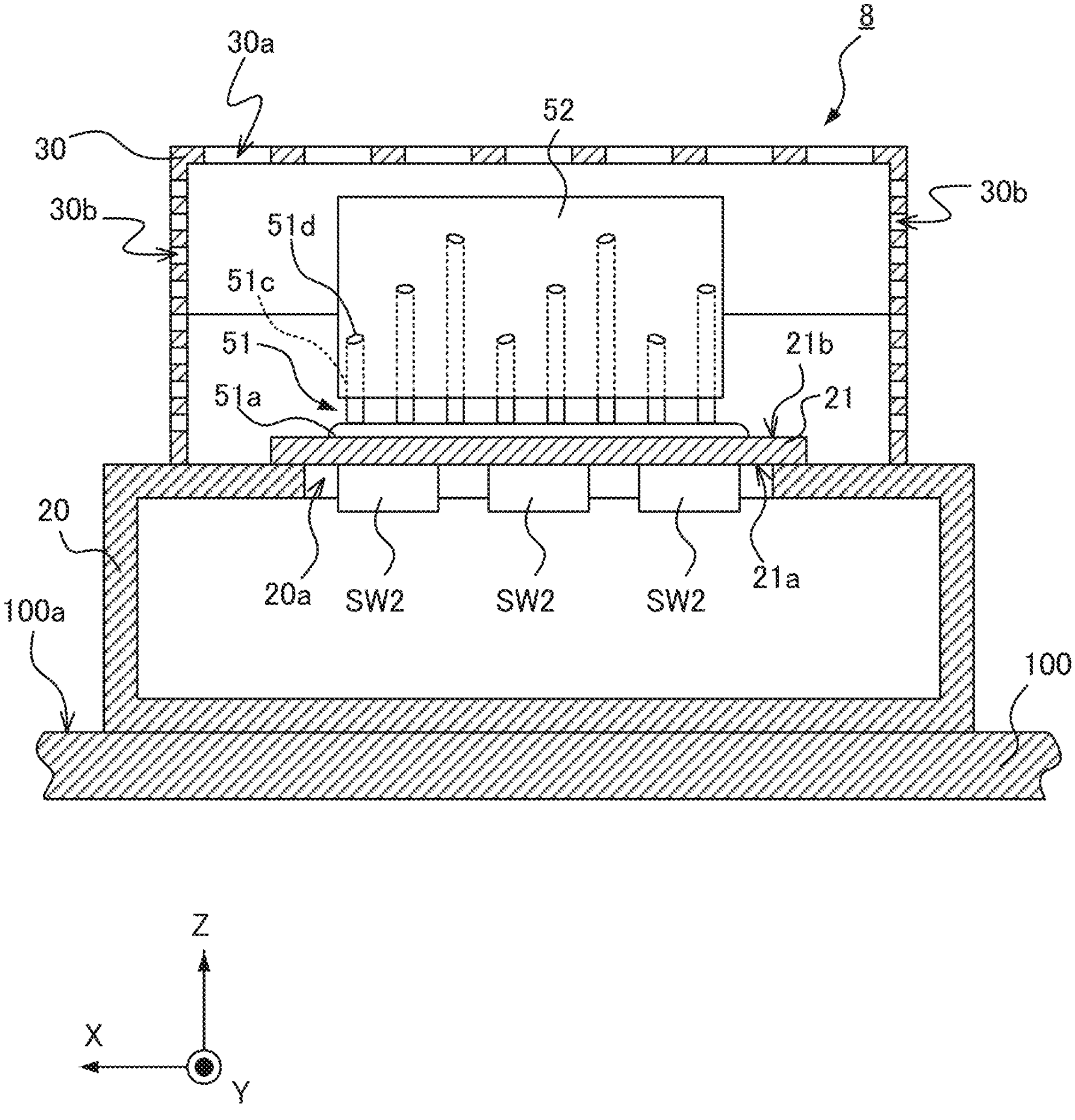
FIG. 21 is a cross-sectional view of an electronic device according to the fourth modification of an embodiment.

To facilitate airflow in the positive Z-direction when the vehicle 100 is stopped, as in the electronic device 8 illustrated in FIG. 21, an elongated circular cross section of at least one of the holders 51*c* may have the longitudinal direction inclined with respect to the horizontal plane, for the vehicle 100 located horizontally.

To flow the airflow to the vertical center of the fins 52 when the vehicle 100 is traveling, at least one of the holders 51*c* in the heat transfer members 51 to which the same fins 52 are attached preferably has the longitudinal direction inclined with respect to the horizontal plane for the vehicle 100 located horizontally. For example, in one of the above holders 51*c* located vertically upward, one end nearer the center of the fins 52 in the travel direction of the vehicle 100 is preferably located vertically lower than the other end. In one of the above holders 51*c* located vertically downward, one end nearer the center of the fins 52 in the travel direction of the vehicle 100 is preferably located vertically higher than the other end.

Figure 22:
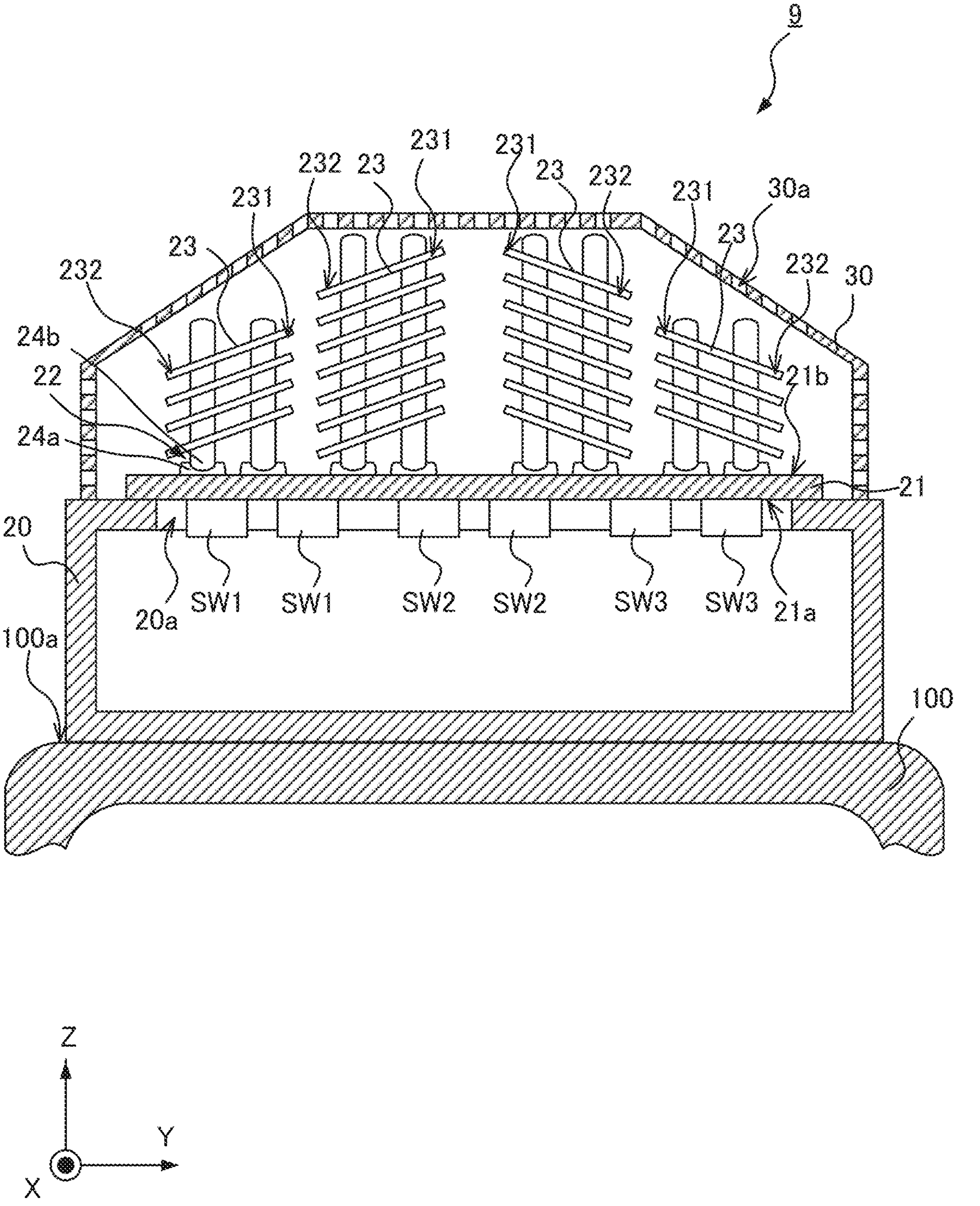
FIG. 22 is a cross-sectional view of an electronic device according to a fifth modification of an embodiment.

The fins 23 having the main surfaces inclined with respect to the horizontal plane may be attached to the heat transfer members 22 in any direction other than in the above examples. For example, as in an electronic device 9 illustrated in FIG. 22, the fins 23 may be attached to the branch pipes 24*b* extending perpendicular to the second main surface 21*b* with one end 231, of two ends in Y-direction, nearer the center of the vehicle 100 located vertically higher than the other end 232 of the two ends.

The fins 23 and 52 may be formed from the same material, or at least one of the fins 23 or 52 may be formed from a material different from the material of the other fins 23 or 52. When at least one of the fins 23 or 52 is formed from a material different from the material of the other fins 23 or 52, the fins 23 or 52 has thermal conductivity different from the thermal conductivity of the other fins 23 or 52. For example, the fins 23 located vertically upward preferably have higher thermal conductivity than the fins 23 located vertically downward. For example, the fins 23 located vertically upward may be formed from copper, and the fins 23 located vertically downward may be formed from aluminum.

Any number of fins 23 or 52 in any shape may be arranged in any manner other than in the above examples. For example, the fins 23 or 52 may be plates with curved surfaces. In another example, the fins 23 or 52 may have different shapes. In another example, the fins 23 may be arranged in Z-direction. In this case, the fins 23 located vertically downward may be attached to all the heat transfer members 22. In another example, the fins 52 may be arranged in X-direction and Y-direction. When the fins 52 are arranged in X-direction, air receives heat transferred from the fins 52 to be heated when the vehicle 100 is stopped, and can move vertically between the fins 52 adjacent to one another in X-direction. Thus, the electronic devices 3 and 4 have enhanced cooling performance.

The cover 30 may have any shape that covers the heat transfer members 22 and the fins 23 or the heat transfer members 51 and the fins 52 and allows air to flow inside. In an example, the cover 30 may have a vertically upper surface that is curved. In another example, the cover 30 may have a vertically upper surface that is flat. The cover 30 may have a shape that maximizes the inside space below the vehicle limit.

As in the electronic device 2, each of the electronic devices 3 to 9 may be received in the container 100*b* that is a recess open vertically upward on the roof 100*a* of the vehicle 100.

When other devices are located around each of the electronic devices 1 to 9, the fins 23 located vertically upward can more easily come in contact with air flowing from the outside than the fins 23 located vertically downward. Similarly, the fins 52 located vertically upward can more easily come in contact with air flowing from the outside than the fins 52 located vertically downward. For example, when the fins 23 located vertically upward have higher thermal conductivity, and the fins 52 having the vertically upper ends located higher than the vertically upper ends of the other fins 52 have higher thermal conductivity, the electronic devices 1 to 9 can have enhanced cooling performance.

The electronic devices 1 to 9 may each be installable on a DC feeding railway vehicle, rather than on an AC feeding railway vehicle. The electronic devices 1 to 9 may each be installable on any vehicle that creates airflow such as a trolley bus or a streetcar, rather than the railway vehicle.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of International Application No. PCT/JP2021/022795, filed on Jun. 16, 2021, the entire disclosure of which is incorporated by reference herein.

REFERENCE SIGNS LIST

1, 2, 3, 4, 5, 6, 7, 8, 9 Electronic device
1*a*, 1*b* Input terminal
11 Transformer
12 Converter
13, 14 Inverter
15 Transformer
20, 25 Housing
20*a*, 25*a* Opening
21 Heat-receiving block
21*a* First main surface
21*b* Second main surface
22, 51 Heat transfer member
23, 41, 52 Fin
24*a* Header
24*b* Branch pipe
30 Cover
30*a*, 30*b* Ventilation hole
42 Heat pipe
51*a* Base
51*b* Extension
51*c*, 51*d* Holder
53 Heat dissipater
61 Motor
62 Air-conditioning device
100 Vehicle
100*a* Roof
100*b* Container
231, 232 End
AR1, AR2, AR3, AR4, AR5, AR6, AR7 Arrow
C1 Capacitor
D1, D2 Extension direction
SW1, SW2, SW3 Switching element
θ1, θ2 Angle

The invention claimed is:

1. An electronic device installable on a vehicle, the electronic device comprising:

a heat-receiving block being heat conductive, the heat-receiving block having a first main surface to which an electronic component is attached;

a heat transfer member attached to a second main surface of the heat-receiving block, the second main surface being opposite to the first main surface, the heat transfer member extending away from the second main surface to transfer heat transferred from the electronic component through the heat-receiving block in a direction away from the second main surface;

one or more fins having main surfaces, the one or more fins being attached to the heat transfer member with the main surfaces being inclined at a nonzero angle with respect to a horizontal plane for the vehicle being located horizontally and configured to dissipate heat transferred from the electronic component through the heat-receiving block and the heat transfer member into ambient air; and a housing accommodating the electronic component, the housing having an opening in a vertically upper portion of the housing, the housing being installable on a roof of the vehicle, wherein the heat-receiving block is attached to the housing with the first main surface covering the opening of the housing.

2. An electronic device installable on a vehicle, the electronic device comprising:

a heat-receiving block being heat conductive, the heat-receiving block having a first main surface to which an electronic component is attached;

a heat transfer member attached to a second main surface of the heat-receiving block, the second main surface being opposite to the first main surface, the heat transfer member extending away from the second main surface to transfer heat transferred from the electronic component through the heat-receiving block in a direction away from the second main surface; and a plurality of fins having main surfaces, the plurality of fins being attached to the heat transfer member with the main surfaces being inclined with respect to a horizontal plane for the vehicle being located horizontally and configured to dissipate heat transferred from the electronic component through the heat-receiving block and the heat transfer member into ambient air, wherein the plurality of fins are arranged in a width direction of the vehicle, and each fin of the plurality of fins attached to the heat transfer member has, for the vehicle being located horizontally, one of two ends in the width direction nearer a center of the vehicle located vertically lower than the other of the two ends.

3. An electronic device installable on a vehicle, the electronic device comprising:

a heat-receiving block being heat conductive, the heat-receiving block having a first main surface to which an electronic component is attached;

a heat transfer member attached to a second main surface of the heat-receiving block, the second main surface being opposite to the first main surface, the heat transfer member extending away from the second main surface to transfer heat transferred from the electronic component through the heat-receiving block in a direction away from the second main surface; and a plurality of fins having main surfaces, the plurality of fins being attached to the heat transfer member with the main surfaces being inclined with respect to a horizontal plane for the vehicle being located horizontally and configured to dissipate heat transferred from the electronic component through the heat-receiving block and the heat transfer member into ambient air, wherein the plurality of fins are arranged in four rows in a width direction of the vehicle, the plurality of fins attached to the heat transfer member include fins in two rows at respective two ends in the width direction, and each of the fins in the two rows at the respective two ends has, for the vehicle being located horizontally, one of two ends in the width direction nearer a center of the vehicle located vertically higher than the other of the two ends, and the plurality of fins attached to the heat transfer member include fins in two rows at the center of the vehicle in the width direction, and each of the fins in the two rows at the center has, for the vehicle being located horizontally, one of two ends in the width direction nearer the center of the vehicle vertically lower than the other of the two ends.

4. The electronic device according to claim 1, wherein the one or more fins include a plurality of fins arranged in a width direction of the vehicle and in the direction away from the second main surface.

5. The electronic device according to claim 1, wherein the one or more fins include a plurality of fins arranged in a width direction of the vehicle, and the plurality of fins attached to the heat transfer member have main surfaces perpendicular to a horizontal direction for the vehicle being located horizontally.

6. The electronic device according to claim 5, wherein the plurality of fins are arranged in the width direction and in the direction away from the second main surface, and at least one fin of the plurality of fins arranged in the direction away from the second main surface is displaced in the width direction from another of the plurality of fins adjacent to the at least one fin in the direction away from the second main surface.

7. The electronic device according to claim 1, wherein the heat transfer member extends vertically for the vehicle being located horizontally.

8. The electronic device according to claim 1, wherein the heat transfer member extends at an acute angle with respect to the horizontal plane for the vehicle being located horizontally.

9. The electronic device according to claim 8, wherein the electronic device includes a plurality of the heat transfer members arranged in a width direction of the vehicle, and the plurality of heat transfer members extend away from the second main surface and extend from a center toward an end in the width direction.

10. The electronic device according to claim 8, wherein the electronic device includes a plurality of the heat transfer members arranged in a width direction of the vehicle, the plurality of heat transfer members include a heat transfer member nearer an end of the vehicle in the width direction extending away from the second main surface and extending toward the end of the vehicle in the width direction, and the plurality of heat transfer members include a heat transfer member nearer a center of the vehicle in the width direction extending away from the second main surface and extending toward the center of the vehicle in the width direction.

11. The electronic device according to claim 1, wherein the second main surface of the heat-receiving block is inclined with respect to the horizontal plane for the vehicle being located horizontally.

12. The electronic device according to claim 1, wherein the heat transfer member includes a base attached to the heat-receiving block, an extension attached to the base and extending away from the heat-receiving block, and a holder attached to the extension, the holder extending away from the extension, the holder holding the one or more fins attached to the holder.

13. The electronic device according to claim 12, wherein the holder extends along the second main surface.

14. The electronic device according to claim 12, wherein the holder has one end attached to the extension at a position vertically lower than the other end of the holder.

15. The electronic device according to claim 12, wherein the heat transfer member includes a plurality of the holders, and the plurality of holders each have an elongated circular cross section when taken perpendicular to an extension direction of the holder, and the elongated circular cross section of at least one of the plurality of holders has a longitudinal direction inclined with respect to the horizontal plane for the vehicle being located horizontally.

16. The electronic device according to claim 1, wherein the electronic component receives power and generates heat independently of whether the vehicle is traveling.

17. The electronic device according to claim 1, wherein the heat transfer member includes a heat pipe containing a coolant therein.

18. The electronic device according to claim 1, wherein the housing is accommodated in a container being a recess open vertically upward on the roof of the vehicle.

19. The electronic device according to claim 18, wherein for the vehicle being located horizontally, the heat transfer member and the one or more fins each have a vertically upper end located higher than a vertically upper end of the recess.

20. The electronic device according to claim 1, wherein the heat-receiving block is disposed outside the housing.

* * * * *